United States Patent
Kayano

(10) Patent No.: US 7,528,652 B2
(45) Date of Patent: May 5, 2009

(54) AMPLIFYING DEVICE AND RADIO COMMUNICATION CIRCUIT

(75) Inventor: Hiroyuki Kayano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/534,368

(22) Filed: Sep. 22, 2006

(65) Prior Publication Data

US 2007/0241814 A1  Oct. 18, 2007

(30) Foreign Application Priority Data

Apr. 14, 2006  (JP) ............................. 2006-112331

(51) Int. Cl.
H03F 3/68  (2006.01)

(52) U.S. Cl. ..................... 330/126; 330/149

(58) Field of Classification Search ............. 330/124 R, 330/126, 295
See application file for complete search history.

(56) References Cited

U.S. PATENT DOCUMENTS

| 6,107,898 | A | 8/2000 | Rauscher |
| 6,518,854 | B2 | 2/2003 | Kayano et al. |
| 6,759,930 | B2 | 7/2004 | Kayano et al. |
| 6,888,425 | B2* | 5/2005 | Matsui et al. ............... 333/219 |
| 7,126,422 | B2* | 10/2006 | Suzuki et al. ............... 330/151 |
| 7,268,616 | B2* | 9/2007 | Burns et al. ............. 330/124 R |
| 2004/0041635 | A1 | 3/2004 | Sano et al. |
| 2005/0285701 | A1 | 12/2005 | Kayano et al. |
| 2007/0241814 | A1 | 10/2007 | Kayano |

FOREIGN PATENT DOCUMENTS

| JP | 53-024252 | 3/1978 |
| JP | 10-051232 | 2/1998 |
| JP | 11-330803 | 11/1999 |
| JP | 2001-345601 | 12/2001 |
| JP | 2002-513227 | 5/2002 |
| JP | 2004-096399 | 3/2004 |

(Continued)

OTHER PUBLICATIONS

U.S. Appl. No. 11/534,069, filed Sep. 21, 2006, Hiroyuki Kayano.

(Continued)

Primary Examiner—Robert Pascal
Assistant Examiner—Hieu P Nguyen
(74) Attorney, Agent, or Firm—Oblon, Spivak, McClelland, Maier & Neustadt, P.C.

(57) ABSTRACT

There is provided with an amplifying device including: an input terminal configured to input an input signal; first to ith blocks including first to ith resonators having different first to ith resonance frequencies and first to ith amplifiers that amplify signals which have passed through the first to ith resonators; a divider configured to divide the input signal for the first to ith resonators; a combination section configured to combine the signals which have passed through the first to ith blocks to obtain a combined signal; and an output terminal configured to output the combined signal, wherein a jth (j: an integer between 1 and i−1) block includes a phase adjustment section which provides an output signal of the jth block with a phase difference within a range of $\{(180\pm30)+(360\times n)\}$ degrees (n: an integer of 0 or greater) from an output signal that passes through a (j+1)th block.

16 Claims, 22 Drawing Sheets

FOREIGN PATENT DOCUMENTS

| | | |
|---|---|---|
| JP | 2004-147011 | 5/2004 |
| JP | 2006-014068 | 1/2006 |

OTHER PUBLICATIONS

U.S. Appl. No. 11/477,435, filed Jun. 30, 2006, Hiroyuki Kayano.

Mitsuru Honjoh, et al., "Synthesis of Microwave Circuits by Normal Mode Expansion-Synthesis of Rectangular Waveguide Filter with Dielectric Sheet Window", IEICE Technical Report (Japanese), MW 82-54, 1982, pp. 9-16.

U.S. Appl. No. 12/235,951, filed Sep. 23, 2008, Kayano.

* cited by examiner

AMPLIFYING DEVICE AND RADIO COMMUNICATION CIRCUIT

CROSS-REFERENCE TO RELATED APPLICATIONS

This application is based upon and claims the benefit of priority from the prior Japanese Patent Applications No. 2006-112331 filed on Apr. 14, 2006, the entire contents of which are incorporated herein by reference.

BACKGROUND OF THE INVENTION

1. Field of the Invention

The present invention relates to an amplifying device and radio communication circuit.

2. Related Art

An amplifying device is used to amplify a signal to desired electric field strength. When one amplification device alone cannot amplify a signal to desired power, it is possible to use a method as follow. In this method, a plurality of amplification devices are connected in parallel, then output power of the respective amplification devices is in-phase combined, and thereby desired power is obtained.

On the other hand, since an amplification device used in an amplifying device has non-linearity, there is a problem that it outputs non-linear distortion together with the signal. As one scheme for this problem, there is a method of operating the amplification device in an area of low output with good linearity. But this method involves a problem that efficiency deteriorates significantly in the low output area.

Therefore, a method called "push-pull" is available to operate the amplifying device with high efficiency whereby non-linear amplification devices are connected in parallel, time of operating each amplification device is changed respectively, and thereby linear output is realized. In addition to this, there is also a method using a linearizer circuit to eliminate distortion outputted from a non-linear amplification device. A general method of using a linearizer circuit is a method using a pre-distortion type linearizer circuit to which a signal having reverse distortion of an amplification device is given beforehand and which gives the sum of the signal having reverse distortion and an input signal to the amplifying device. Furthermore, there is also a feed-forward type linearizer circuit which extracts a distortion signal from an output signal of an amplification device, generates a reverse distortion signal from the extracted distortion signal and subtracts this reverse distortion signal from the output signal of the amplification device to thereby eliminate distortion.

However, these methods have such problems that an additional circuit, temperature stabilization circuit or the like is necessary or that the amplifying device configuration is complicated and it requires considerable development time. Furthermore, the output of the amplifying device still includes distortion and it is difficult to eliminate this distortion even when a filter is provided after the amplifying device.

SUMMARY OF THE INVENTION

According to an aspect of the present invention, there is provided with an amplifying device comprising:

an input terminal configured to input an input signal;

first to ith blocks including first to ith resonators having respectively different first to ith resonance frequencies (first resonance frequency<second resonance frequency<...<ith resonance frequency) and first to ith amplifiers that amplify signals which have passed through the first to ith resonators;

a divider configured to divide the input signal for the first to ith resonators;

a combination section configured to combine the signals which have passed through the first to ith blocks to obtain a combined signal; and an output terminal configured to output the combined signal, wherein a jth (j: an integer between 1 and i−1) block includes a phase adjustment section which provides an output signal of the jth block with a phase difference within a range of $\{(180\pm30)+(360\times n)\}$ degrees (n: an integer of 0 or greater) from an output signal that passes through a (j+1)th block.

According to an aspect of the present invention, there is provided with an amplifying device comprising:

an input terminal configured to input transmission data;

first to ith blocks;

a signal processing circuit configured to perform transmission processing on the transmission data to generate transmission signal and divide the transmission signal for the first to ith blocks;

a power combination section configured to combine signals that have passed through the first to ith blocks to obtain a combined signal; and an output terminal configured to output the combined signal, wherein the first to ith blocks include:

first to ith frequency converters configured to convert frequencies of signals that pass through the first to ith blocks;

first to ith oscillators configured to give first to ith reference signals having respectively different first to ith frequencies (first frequency<second frequency<...<ith frequency) to the first to ith frequency converters;

first to ith amplifiers configured to amplify signals that pass through the first to ith blocks; and first to ith resonators configured to have resonance frequencies of the same frequencies as the first to ith frequencies and extract signals depending on the resonance frequencies from the signals amplified by the first to ith amplifiers, wherein jth (j: an integer between 1 and i−1) and (j+1)th oscillators give the jth and (j+1)th reference signals having different phases to the jth and (j+1)th frequency converters to provide the signals that pass through the jth and (j+1)th blocks with phase differences within a range of $\{(180\pm30)+(360\times n)\}$ degrees (n: an integer of 0 or greater).

According to an aspect of the present invention, there is provided with a radio communication circuit comprising:

an input terminal configured to input transmission data;

first to ith blocks;

a signal processing circuit configured to perform transmission processing on the transmission data to generate transmission signal and divide the transmission signal for the first to ith blocks;

a power combination section configured to combine signals that have passed through the first to ith blocks to obtain a combined signal; and an output terminal configured to output the combined signal, wherein the first to ith blocks includes:

first to ith frequency converters configured to convert frequencies of signals that pass through the first to ith blocks;

first to ith oscillators configured to give first to ith reference signals having respectively different first to ith frequencies (first frequency<second frequency<...<ith frequency) to the first to ith frequency converters;

first to ith amplifiers configured to amplify signals that pass through the first to ith blocks; and first to ith resonators configured to have resonance frequencies of the same frequencies as the first to ith frequencies and extract signals depending on the resonance frequencies from the signals amplified by the first to ith amplifiers, wherein a jth (j: an integer between 1 and i−1) block further includes a phase adjustment section which provides an output signal of the jth block with a phase difference within a range of $\{(180\pm30)+(360\times n)\}$ degrees (n: an integer of 0 or greater) from an output signal that passes through a (j+1)th block.

DETAILED DESCRIPTION OF THE INVENTION

Figure 1:
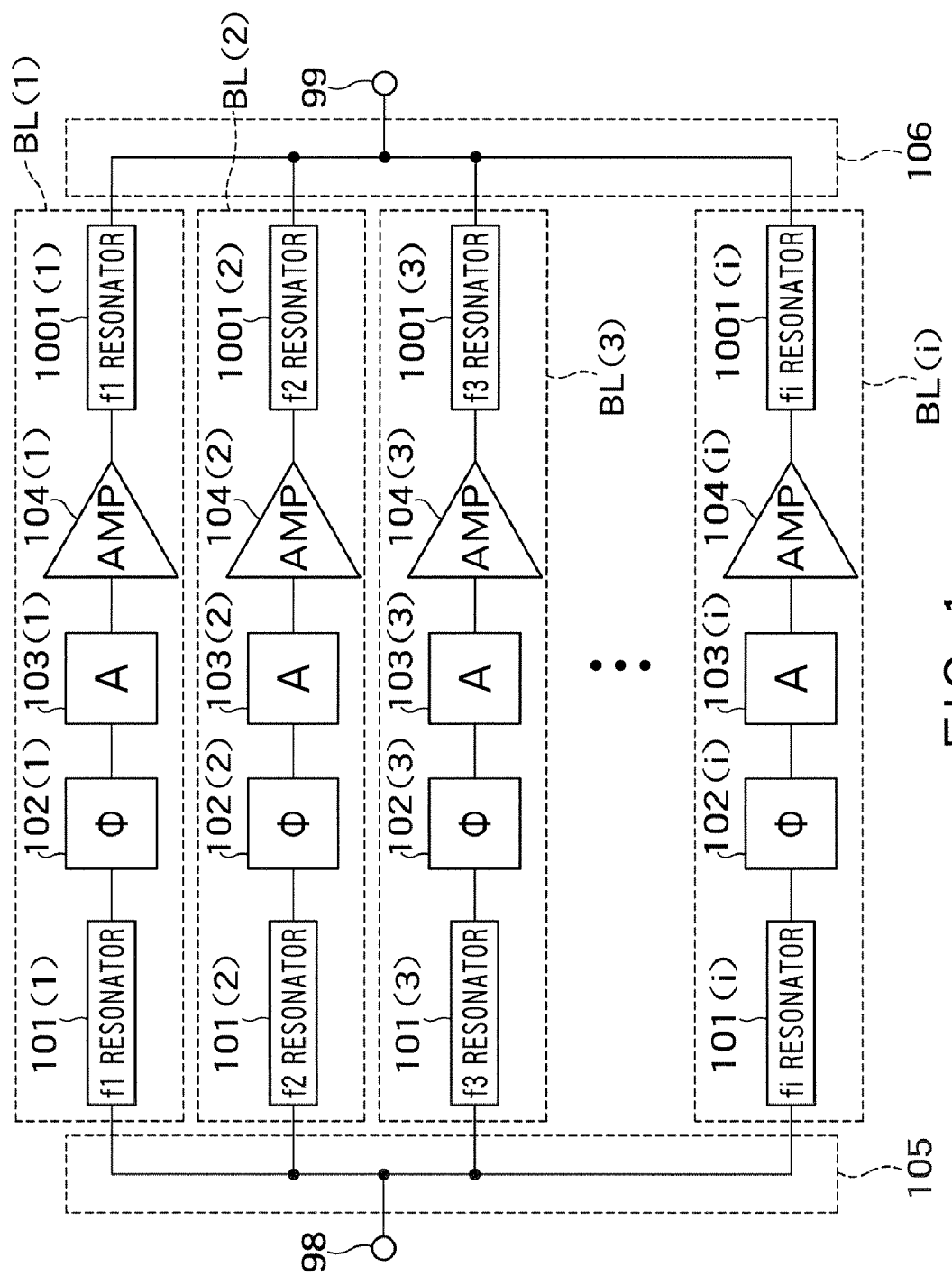
FIG. 1 is a block diagram showing an embodiment of an amplifying device of the present invention.

FIG. 1 shows a first embodiment of an amplifying device according to the present invention.

This amplifying device is provided with an input terminal 98, a power divider 105, blocks BL(1) to BL(i) (i: an integer of 2 or greater), a power combiner (power combination section) 106 and an output terminal 99. The blocks BL(1) to BL(i) are connected in parallel to the power divider 105 on the input side and connected in parallel to the power combiner 106 on the output side.

The block BL(X) (X=1 to i) includes a resonator 101(X), a variable phase section (phase adjustment section) 102(X), a variable amplitude section (amplitude adjustment section) 103(X), an amplifier 104(X) and a resonator 1001(X). Examples of the resonator 101(X) and resonator 1001(X) include a cavity type, dielectric resonator type, transmission line type having transmission line of m (m: an integer of 1 or greater) times the half-wavelength and concentrated constant type using an inductor and capacitor or the like. A superconductor may also be used as a conductive part of the resonator 101(X) and resonator 1001(X). In this case, a signal of steeper shape can be extracted. A resonator using a superconductor is especially effective for use in a narrow-band radio system. The power divider 105 divides an input signal inputted from the input terminal 98 for the blocks BL(1) to BL(i). The signals which have passed through the blocks BL(1) to BL(i) are combined in power by the power combiner 106 and the combined signal is outputted from the output terminal 99.

The resonators 101(1) to 101(i) in the blocks BL(1) to BL(i) have different resonance frequencies f1, f2, . . . , fi. Assuming that there is a relationship of f1<f2< . . . <fi, an interval between resonance frequencies may or may not be constant. In FIG. 1, blocks are arranged in ascending order of resonance frequency, but the block arrangement order is arbitrary. The resonators 101(1) to 101(i) are connected to the amplifiers 104(1) to 104(i) through the variable phase sections 102(1) to 102(i) and variable amplitude sections 103(1) to 103(i). The order of connection between the variable phase section, variable amplitude section and amplifier is arbitrary and, for example, the positions of the variable phase section and variable amplitude section may be switched round. The outputs of the amplifiers 104(1) to 104(i) are connected to the resonators 1001(1) to 1001(i) having the same resonance frequencies f1, f2, . . . , fi as those of the resonators 101(1) to 101(i).

Here, the operations of the variable phase sections 102(1) to 102(i) and variable amplitude sections 103(1) to 103(i) are set such that when the signals (output signals of resonators 1001(1) to 1001(i)) which have passed through the blocks BL(1) to BL(i) are combined in power between neighboring resonance frequency blocks at the power combiner 106 (that is, at a power combination point), combined neighboring signals have a phase difference within a range of (180±30)+360×n degrees (n: an integer of 0 or greater) (substantially opposite phase) and the same amplitude. This allows the signals which have passed through the blocks BL(1) to BL(i) to be combined appropriately. Here, the operations of the variable phase sections 102(1) to 102(i) and variable amplitude sections 103(1) to 103(i) are set through a control signal from outside.

Figure 9:
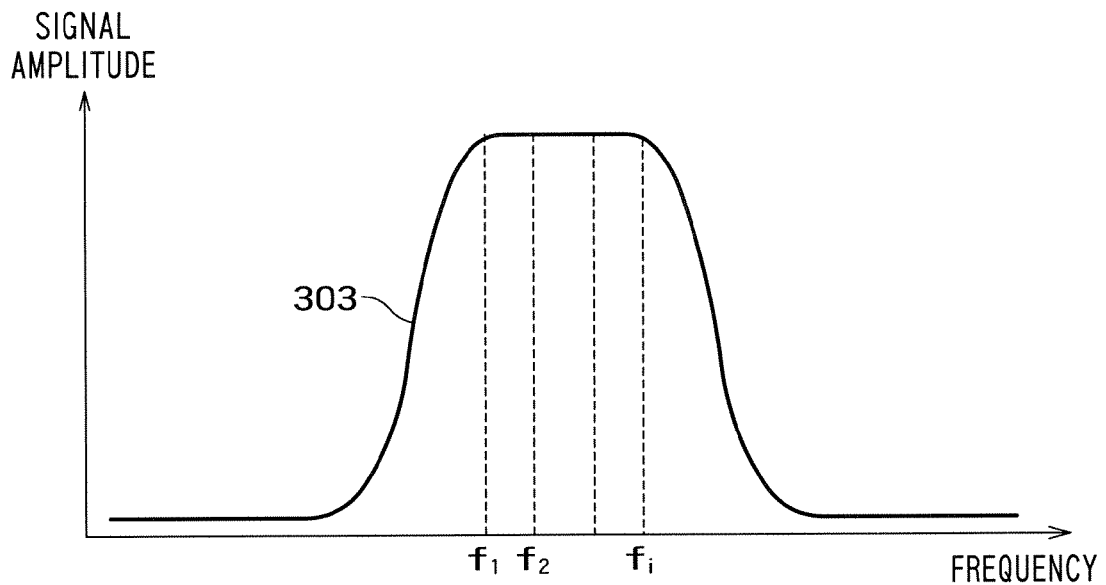
FIG. 9 illustrates an output frequency response characteristic when a modulated signal is inputted to the circuit in FIG. 1.

In operation, a signal inputted from the input terminal 98 is divided for the resonators 101(1) to 101(i) by the power divider 105. Signals corresponding to the resonance frequencies f1, f2, . . . , fi of the resonators 101(1) to 101(i) are extracted at the resonators 101(1) to 101(i) and the extracted signals are given to the amplifiers 104(1) to 104(i) through the variable phase sections 102(1) to 102(i) and variable amplitude sections 103(1) to 103(i). The signals given to the amplifiers 104(1) to 104(i) are amplified according to gains of the amplifiers 104(1) to 104(i). Intermodulation distortion is generated during amplification, but intermodulation distortion is suppressed to a small level for reasons which will be described later. The signals amplified at the amplifiers 104(1) to 104(i) are given to the resonators 1001(1) to 1001(i) and the resonators 1001(1) to 1001(i) remove intermodulation distortion generated at the amplifiers 104(1) to 104(i) as well as distortion generated due to active elements at the variable phase sections 102(1) to 102(i) and variable amplitude sections 103(1) to 103(i). The signals rid of distortion at the resonators 1001(1) to 1001(i) are given to the power combiner 106, combined in power at the power combiner 106 and outputted as a combined signal from the output terminal 99. FIG. 9 shows an example of frequency response when a certain modulated signal is inputted to the amplifying device in FIG. 1.

Hereinafter, the amplifying device in FIG. 1 will be explained more specifically.

First, power combination at the power combiner 106 will be explained in detail using FIG. 2 to FIG. 4.

Figure 2:
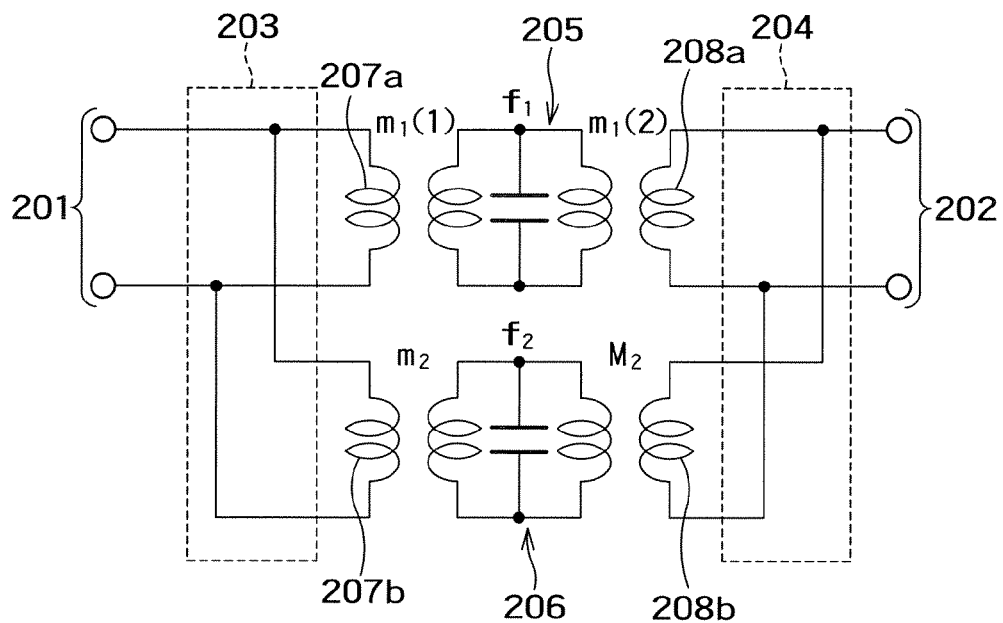
FIG. 2 illustrates principles of power combination.

FIG. 2 is a circuit diagram illustrating the principles of power combination.

A resonator 205 having a resonance frequency f1 and a resonator 206 having a resonance frequency f2 are connected in parallel. Reference numeral 201 denotes input terminals, 202 denotes output terminals, 203 denotes a power divider, 204 denotes a power combiner, 207a denotes a coupling circuit which couples the resonator 205 with the power divider 203, 207b denotes a coupling circuit which couples the resonator 206 with the power divider 203, 208a denotes a coupling circuit which couples the resonator 205 with the power combiner 204 and 208b denotes a coupling circuit which couples the resonator 206 with the power combiner 204.

Figure 3:
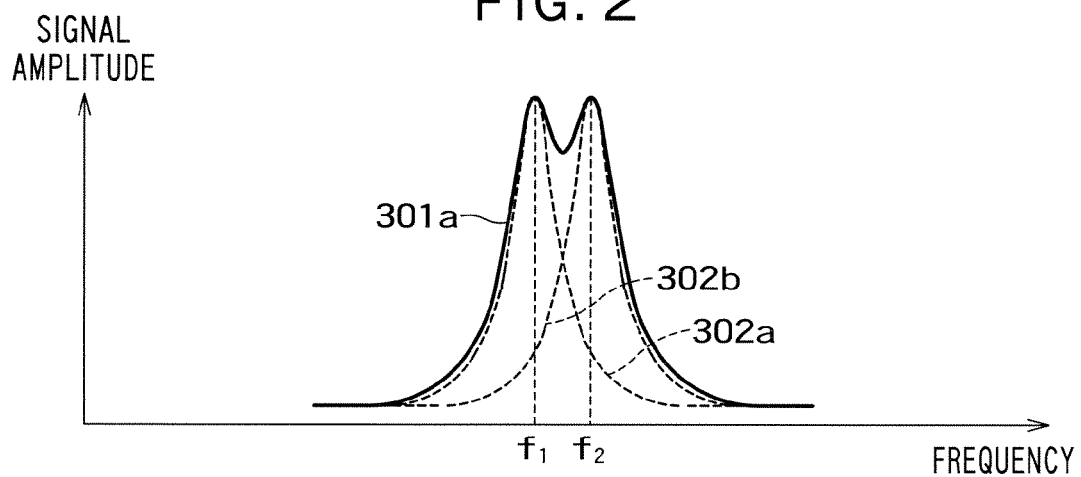
FIG. 3 illustrates a frequency response characteristic when opposite phases are combined.

FIG. 3 shows a frequency response when coupling $M_2$ between the resonator 206 and coupling circuit 208b is reverse phase coupling (phase is inverted by 180 degrees) and a certain signal is inputted to the input terminals 201. Reference numeral 302a denotes a signal extracted by the resonator 205, 302b denotes a signal extracted by the resonator 206 and 301a denotes a signal (combined signal) outputted from the output terminal 202. FIG. 4 shows a frequency response at the output terminals 202 when coupling $M_2$ between the resonator 206 and coupling circuit 208b is in-phase coupling (phase remains unchanged) and the above described certain signal is inputted to the input terminal 201. Reference numeral 302a denotes a signal extracted by the resonator 205, 302b denotes a signal extracted by the resonator 206 and 301b denotes a signal outputted from the output terminals 202. However, suppose coupling $m_1$ (1) between the resonator 205 and coupling circuit 207a, coupling $m_1$ (2) between the resonator 205 and coupling circuit 208a and coupling $M_2$ between the resonator 206 and coupling circuit 207b are in-phase coupling.

Figure 4:
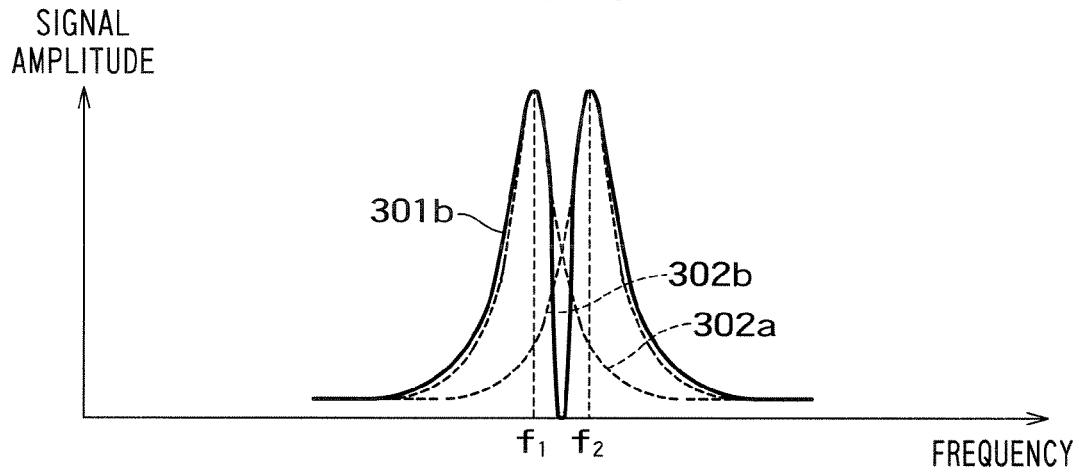
FIG. 4 illustrates a frequency response characteristic when in-phase combination is performed.

When coupling $M_2$ between the resonator 206 and coupling circuit 208b is in-phase coupling, that is, when two signals to be combined are in phase, the signal amplitude near a center frequency in a target band is lowered as shown in FIG. 4 and a desired signal cannot be obtained. This is for the following reason: A conventional amplifying device which is made up of amplification devices simply connected in parallel performs power combination in phase, but with the amplifying device in FIG. 1, phases of signals before and after a resonance frequency as a boundary are inverted at the resonators 101(1) to 101(i) respectively. For this reason, when power combination is performed in phase, a signal with the amplitude in the vicinity of a center frequency lowered in a target band is obtained as shown in FIG. 4. On the contrary, when coupling $M_2$ between the resonator 206 and coupling circuit 208b is reverse phase coupling, phases of two signals having mutually neighboring resonance frequencies become opposite phases before combination, and therefore it is possible to obtain a desired signal as shown in FIG. 3. A desired signal can be obtained even when the two signals to be combined are not completely in opposite phase, if they are substantially in opposite phase, that is, they have a phase difference within a range of (180±30)+360×n degrees (n: an integer of 0 or greater).

Based on the above described principles, to obtain a desired output signal, the amplifying device shown in FIG. 1 sets the operation of the variable phase sections so that signals which pass through blocks of neighboring resonance frequencies are substantially in opposite phase. Furthermore, when power combination is performed, amplitudes of the signals to be combined need to be the same at a power combination point, and therefore the operation of the variable amplitude sections between the blocks of neighboring resonance frequencies is set so as to satisfy this condition. If amplitudes of two signals to be combined can be made the same at the power combination point, the variable amplitude sections may be omitted.

Next, intermodulation distortion generated at the amplifiers 104(1) to 104(i) will be explained.

Figure 5:
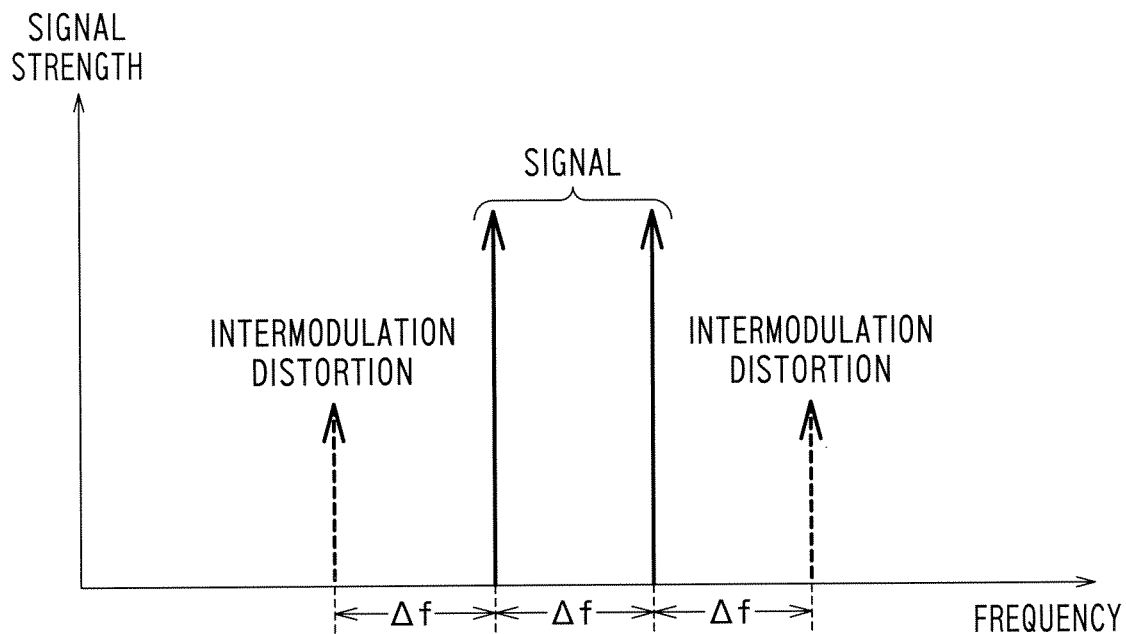
FIG. 5 illustrates an output frequency response characteristic when two sine wave signals of the same level are input to a non-linear amplification device.
Figure 6:
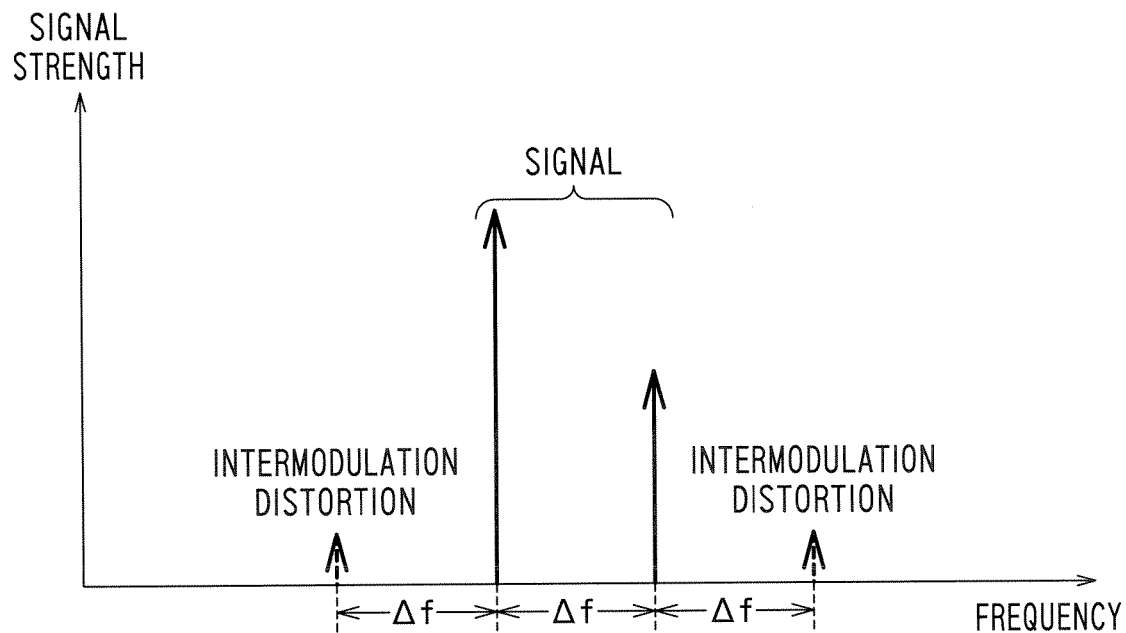
FIG. 6 illustrates an output frequency response characteristic when two sine wave signals of different levels are input to a non-linear amplification device.

FIG. 5 shows an example of an output spectrum when two sine wave signals having the same signal level and different frequencies are inputted to a non-linear amplification device. Solid lines in the figure show output signals when the two inputted sine wave signals are amplified, dotted lines show third-order intermodulation distortion resulting from the two sine wave signals. As is clear from this figure, third-order intermodulation distortion appears over a range three times a signal band Δf (here, frequency difference between the two sine wave signals). FIG. 6 shows an output spectrum when two sine wave signals of different signal levels (signal strength of one sine wave signal is the same as that in the case of FIG. 5 and signal strength of the other sine wave signal is smaller than this) are inputted to a non-linear amplification device. It is understandable that third-order intermodulation distortion has been considerably reduced compared to the case in FIG. 5. Furthermore, though not shown, the same applies to fifth or higher-order intermodulation distortion.

Figure 7:
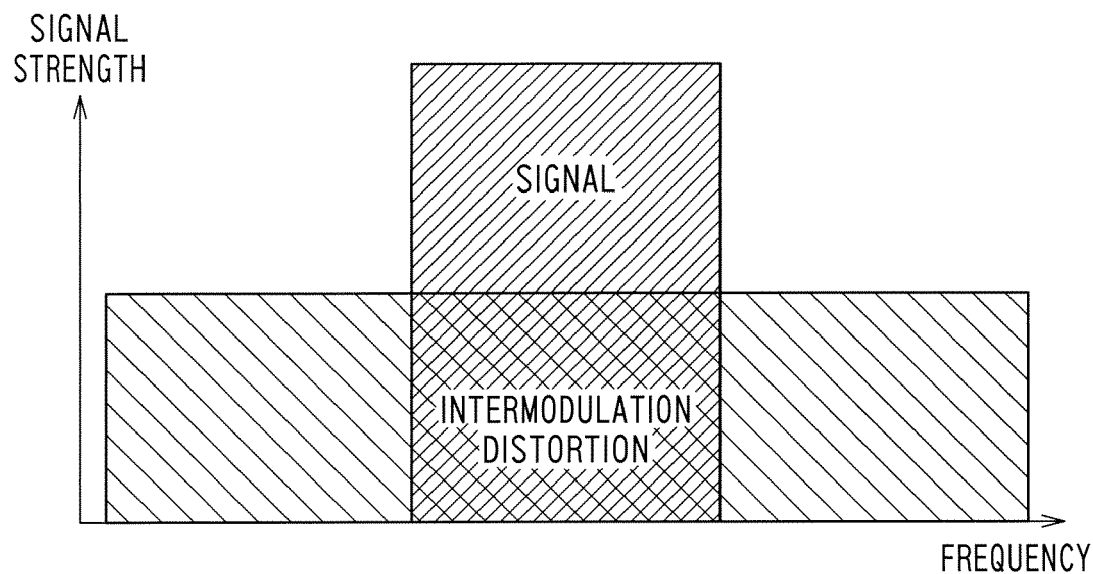
FIG. 7 illustrates an output frequency response characteristic when a modulated signal is inputted to a non-linear amplification device.
Figure 8:
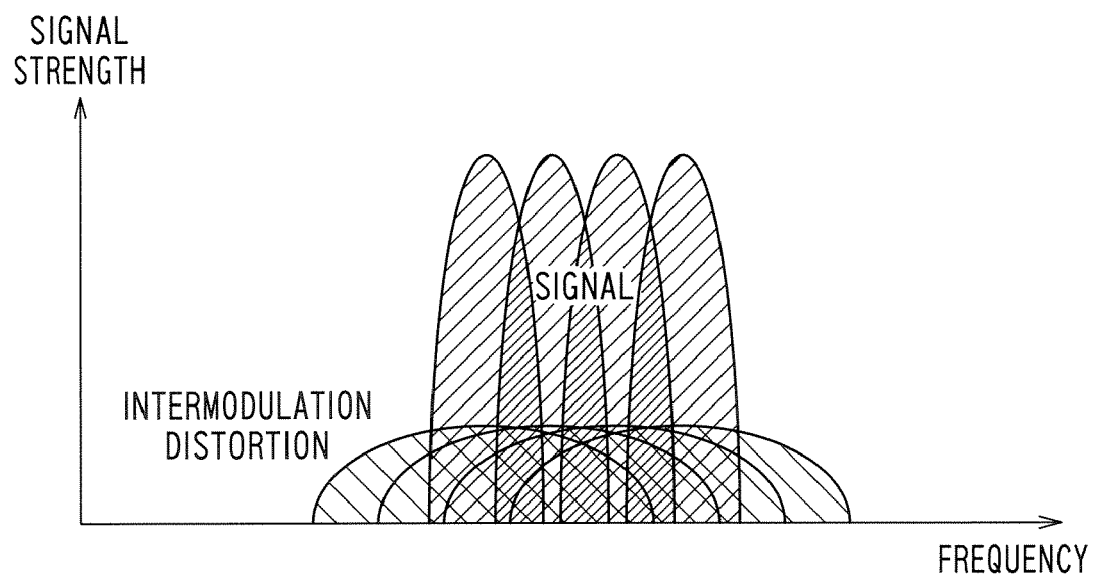
FIG. 8 illustrates an output frequency response characteristic at outputs of the amplification devices when a modulated signal is inputted to the circuit in FIG. 1 (i=4)

FIG. 7 shows an example of an output spectrum when a modulated signal having a certain band (having certain signal strength over an entire band) is inputted to a non-linear amplification device. As in the case of FIG. 5, intermodulation distortion appears over a frequency range three times the band of the input signal. On the other hand, FIG. 8 shows a spectrum in a case where the outputs from the amplifiers 104(1) to 104(4) are superimposed on one another when the above described certain modulated signal is inputted from the input terminal 98 assuming i=4 in FIG. 1.

The signals which have passed through the resonators 101(1) to 101(4) correspond to those obtained by dividing the above described certain modulated signal into four bands. Each signal has a shape similar to a sine waveform (that is, the signal strength of each signal is highest at the center and decreases as it goes away from the center in FIG. 8) and also has a narrower band than the band of the above described certain modulated signal. In this way, each signal has a shape similar to a sine waveform which is hard to be distorted and has a narrow band, and therefore the signal level of intermodulation distortion generated from each signal is also reduced and the signal band of each intermodulation distortion is also narrowed. Therefore, it is possible to obtain an output signal with less distortion by combining the outputs of the amplifiers 104(1) to 104(4) as is also understandable from a comparison between FIG. 7 and FIG. 8. However, in FIG. 1, the resonators 1001(1) to 1001(i) are disposed after the amplifiers 104(1) to 104(i), and therefore these resonators 1001(1) to 1001(i) eliminate intermodulation distortion generated at the amplifiers 104(1) to 104(i) as well as distortion resulting from active elements at the variable phase sections 102(1) to 102(i) and variable amplitude sections 103(1) to 103(i). Therefore, it is possible to obtain an output signal (combined signal) with considerably reduced distortion according to this embodiment.

Figure 10:
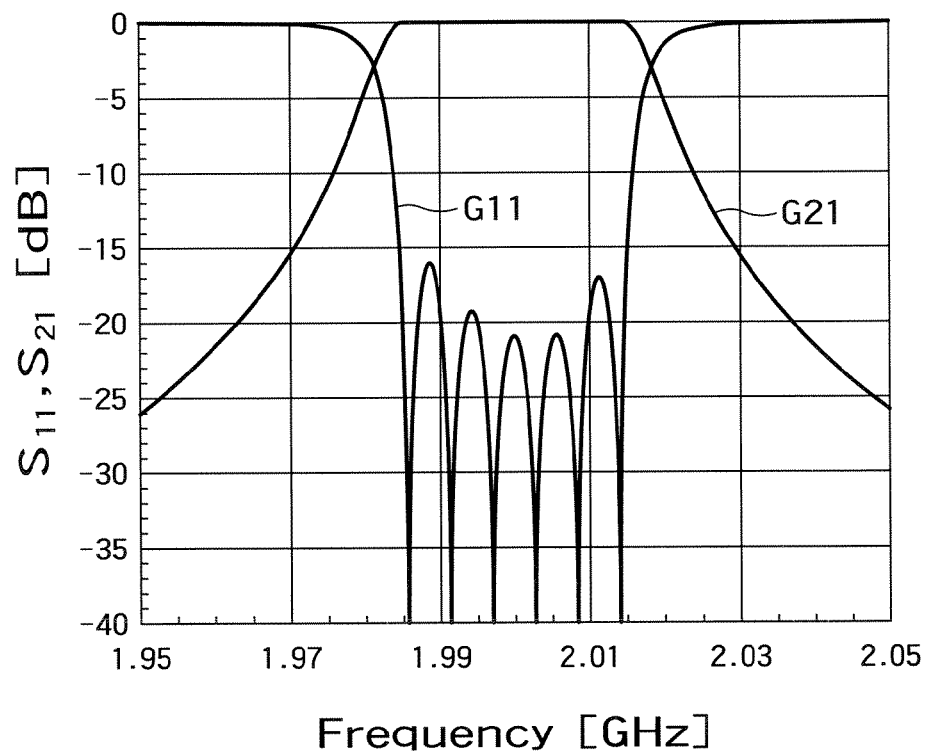
FIG. 10 illustrates an output frequency response characteristic of the circuit in FIG. 1 (i=6)

FIG. 10 illustrates that the amplifying device in FIG. 1 allows a signal in a target band to pass and prevents signals out of the target band from passing. More specifically, FIG. 10 shows an example of frequency response assuming i=6 in the circuit of FIG. 1 and assuming that the gains of the amplifiers 104(1) to 104(6) are 0 dB (frequency responses at the input terminal 98 and output terminal 99).

Here, a flat signal (signal having constant signal strength over the entire frequency band) is used as the input signal to the input terminal 98. Furthermore, the resonance frequencies f1 to f6 of the resonators 101(1) to 101(6), 1001(1) to 1001(6) are assumed to be f1=1.9812 GHz, f2=1.988 GHz, f3=1.9953 GHz, f4=2.0047 GHz, f5=2.012 GHz, f6=2.0188 GHz. Furthermore, a coupling Q value (external coupling Q value) for coupling the resonators 101(1) to 101(6) with an external circuit (coupling circuit for coupling the resonator with the power divider and coupling circuit for coupling the resonator with the variable phase section) is set to Qe=400. Likewise, a coupling Q value for coupling the resonators 1001(1) to 1001(6) with an external circuit (coupling circuit for coupling the resonator with the amplifier and coupling circuit for coupling the resonator with the power combiner) is set to Qe=400. Here, the degree of coupling of the resonator will be defined. Assuming that the coupling Q value on the input side of the resonator is $Q_{in}$ and the coupling Q value on the output side of the resonator is $Q_{out}$, the degree of coupling of the resonator is expressed by $1/(1/Q_{in}+1/Q_{out})$. For example, the degree of coupling of the resonator 101(1) is 1/(1/400+1/400)=200.

FIG. 10 shows a graph (reflection characteristic graph) G11 (frequency response at the input terminal 98) described in a coordinate system where the horizontal axis shows a frequency and the vertical axis shows an $S_{11}$ parameter (=reflected signal voltage/input signal voltage). FIG. 10 still shows a graph (passage characteristic graph) G21 (frequency response at the output terminal 99) described in a coordinate system where the horizontal axis shows a frequency and the vertical axis shows an $S_{21}$ parameter (=output signal voltage/input signal voltage). As is understandable from these characteristic graphs G11, G21, according to this embodiment, signals in a target band are allowed to pass and passage of most signals in non-target bands is rejected (reflected by an input terminal T1). Here, an example where the gains of the amplifiers 104(1) to 104(6) are set to 0 dB has been shown, but by increasing the gains of the amplifiers 104(1) to 104(6), the characteristic graphs G11, G21 are obtained in the form shifted up and down accordingly. Thus, according to this embodiment, it is understandable that a signal in a target band is amplified and outputted with low distortion, while passage of signals in non-target bands is blocked.

Figure 11:
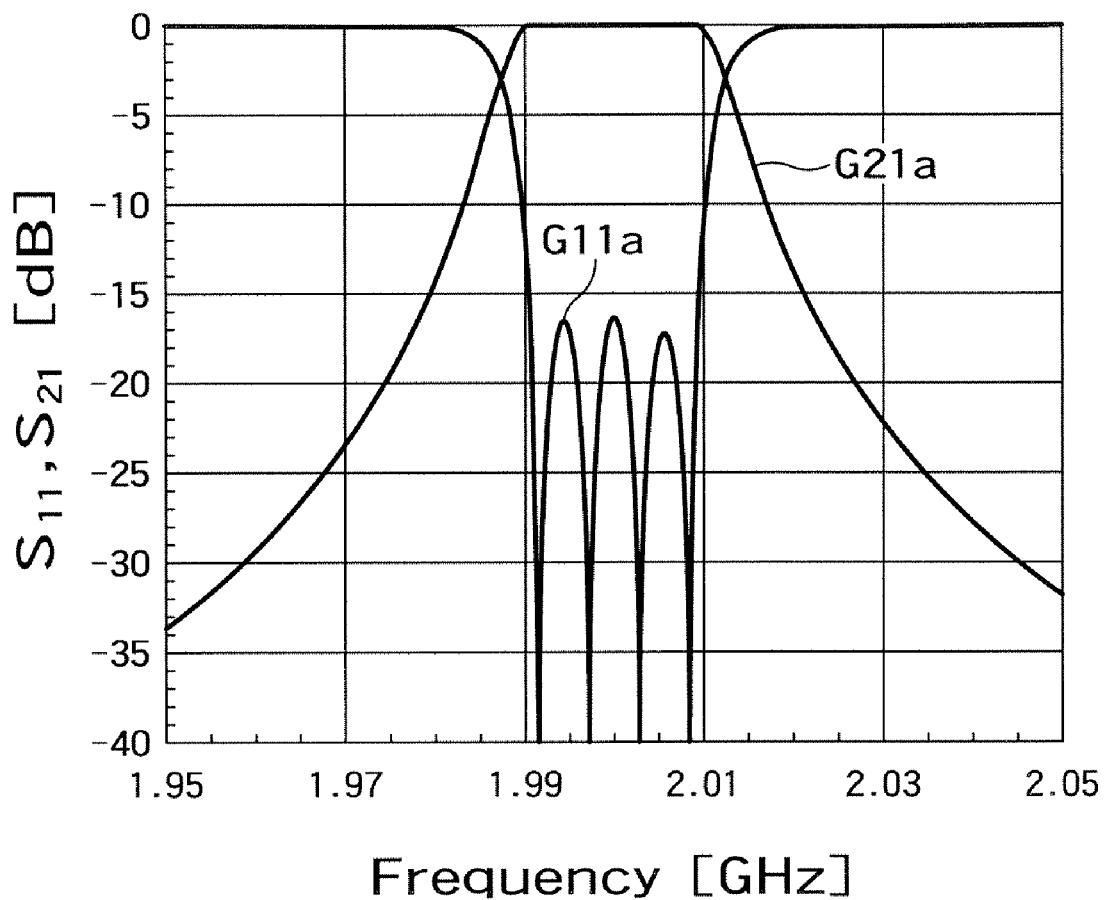
FIG. 11 illustrates an output frequency response characteristic of the circuit in FIG. 1 (i=4)

FIG. 11 shows an example of frequency response (frequency responses at the input terminal 98 and output terminal 99) when four resonators 101(1) to 101(4) and four resonators 1001(1) to 1001(4) are disposed and coupling Q values Qe of resonators differ from one block to another (the degree of coupling of resonators differs from one block to another).

However, as in the case of FIG. 10, suppose the gains of the amplifiers 104(1) to 104(4) are set to 0 dB, resonance frequency f1 of the resonators 101(1), 1001(1) is 1.988 GHz, resonance frequency f2 of the resonators 101(2), 1001(2) is 1.9958 GHz, resonance frequency f3 of the resonators 101(3), 1001(3) is 2.0042 GHz and resonance frequency f4 of the resonators 101(4), 1001(4) is 2.012 GHz. Furthermore, the coupling Q values of the resonators 101(1), 1001(1), 101(4), 1001(4) are supposed to be Qe1, Qe4=500, the coupling Q values of the resonators 101(2), 1001(2), 101(3), 1001(3) are supposed to be Qe2, Qe3=400. That is, the coupling Q values of the resonators at both ends of the target band are increased (the degree of coupling is increased). In this way, by increasing the coupling Q values of the resonators at both ends of the target band, it is possible to increase the amount of attenuation outside the target band as is also understandable from a graph G11a of the $S_{11}$ parameter and graph G21a of the $S_{21}$ parameter.

Figure 12:
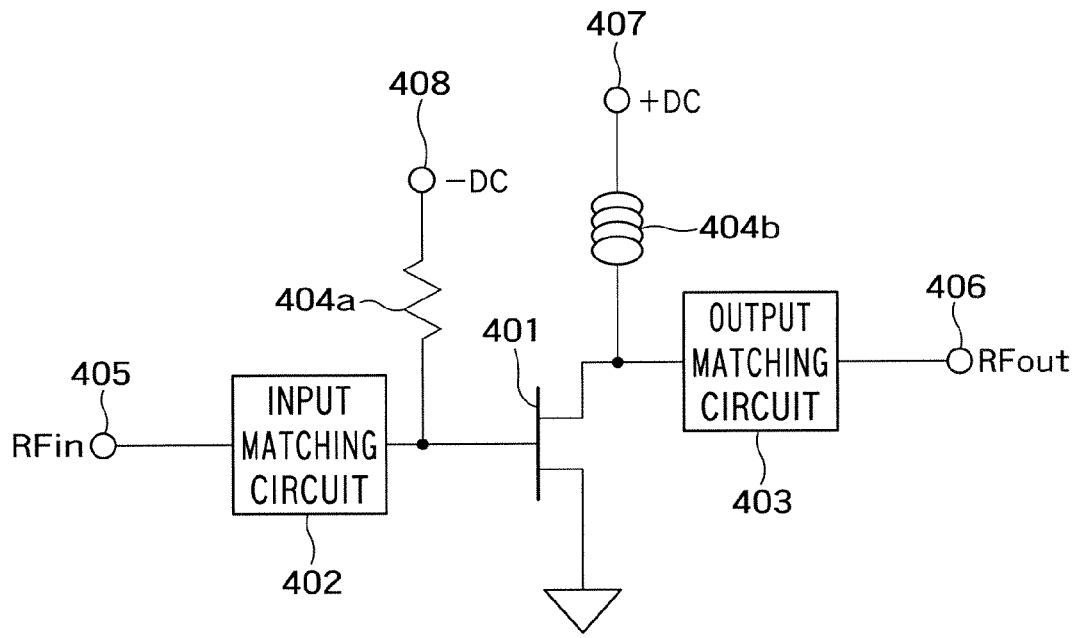
FIG. 12 is a circuit diagram showing a specific configuration example of the amplifier.

FIG. 12 shows an example of the specific configuration of the amplifiers 104(1) to 104(i).

An example using a field effect transistor 401 as the amplification device is shown. The source of the field effect transistor 401 is grounded. An input matching circuit 402 is connected to the gate of the field effect transistor 401 and an output matching circuit 403 is connected to the drain of the field effect transistor 401. One end of a bias circuit 404a is connected to the gate of the field effect transistor 401 and the other end is connected to a gate terminal 408. One end of a bias circuit 404b is connected to the drain of the field effect transistor 401 and the other end is connected to a drain terminal 407. An example using a resistor as the bias circuit 404a and using an inductor as the bias circuit 404b is shown here. Reference numeral 405 denotes an input terminal and 406 denotes an output terminal. A negative voltage is applied to the gate terminal 408, a positive voltage is applied to the drain terminal 407, a signal is inputted from the input terminal 405 and an output signal is obtained from the output terminal 406.

Figure 13:
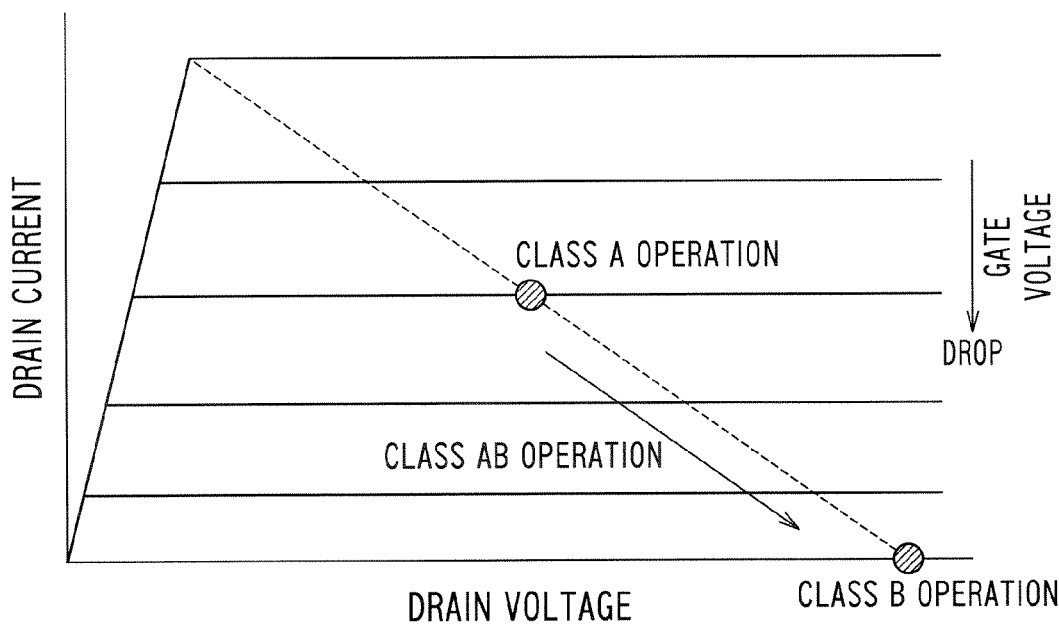
FIG. 13 illustrates an I-V curve in a field effect transistor.

FIG. 13 shows an I-V (drain current-drain voltage) curve of the field effect transistor 401. As is understandable from this I-V curve, it is possible to make a current of the transistor variable by changing the gate voltage. Furthermore, as shown by an arrow in the figure, it is possible to change power consumption by changing the operating point of the transistor. When linearity is required, the transistor is operated as class A and when efficiency is required, the transistor is operated as class B. When an intermediate characteristic is required, the transistor is operated as class AB. This allows power consumption of the amplification device itself to be controlled. Furthermore, by setting the operating point of the transistor at the amplifiers 104(1) to 104(i) according to an energy density of signals inputted to the amplifiers 104(1) to 104(*i*), it is possible to realize high operation efficiency. This method is effective especially when the modulation scheme changes with time. For example, when an energy distribution on the frequency axis changes such that QPSK (Quadrature Phase Shift Keying) modulation is used for a certain time period and GMSK (Gaussian filtered Minimum Shift Keying) modulation is used for another time period, it is possible to realize amplification with less efficiency deterioration under each modulation scheme by changing the operating point of the transistor. Furthermore, when a bipolar type device is used, similar effects can be obtained by changing the base voltage.

Figure 14:
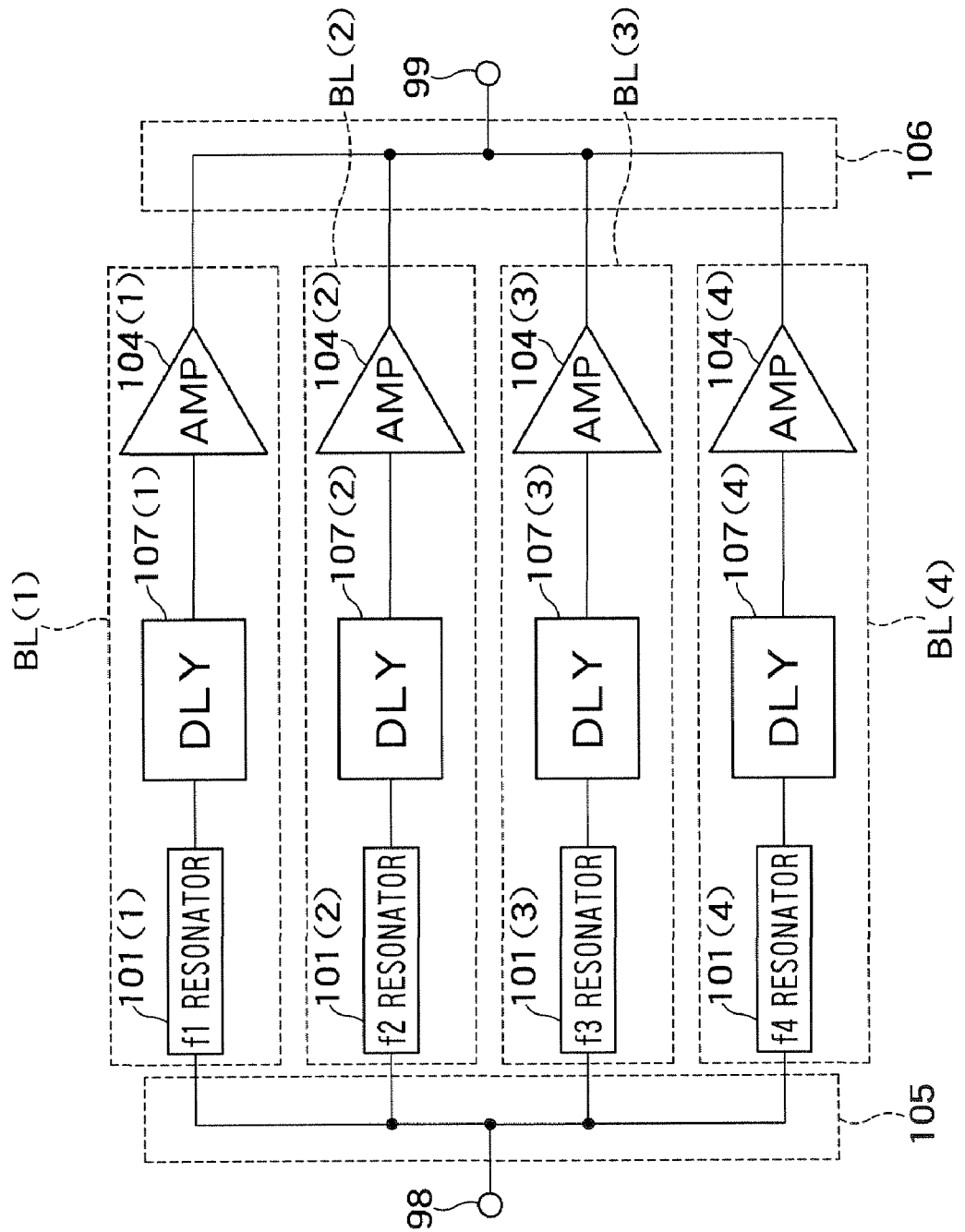
FIG. 14 is a block diagram showing an embodiment of the amplifying device of the present invention.

FIG. 14 shows a second embodiment of the amplifying device according to the present invention.

Using delay circuits (delayers) 107(1) to 107(4) as the variable phase sections in FIG. 1, this amplifying device is designed so that signals passing through blocks of neighboring resonance frequencies have a phase difference within a range of (180±30)+360×n degrees (n: an integer of 0 or greater) at a power combination point. When, for example, a phase delay of 1800 occurs in each of resonators 101(1) to 101(4), the delay circuits 107(2), 107(4) generate a phase delay of 180° and the delay circuits 107(1), 107(3) generate a phase delay of 0°. In this way, it is possible to obtain an output signal with less distortion by using delay circuits not including any active elements (transistors). In FIG. 1, the resonators 1001(1) to 1001(*i*) are disposed on the output side to realize smaller distortion but no resonator is disposed on the output side in this embodiment. When the distortion specification is relatively not stringent, it is possible to obtain an output signal at a degree that does not cause trouble with communications even with the resonator on the output side omitted.

Figure 15:
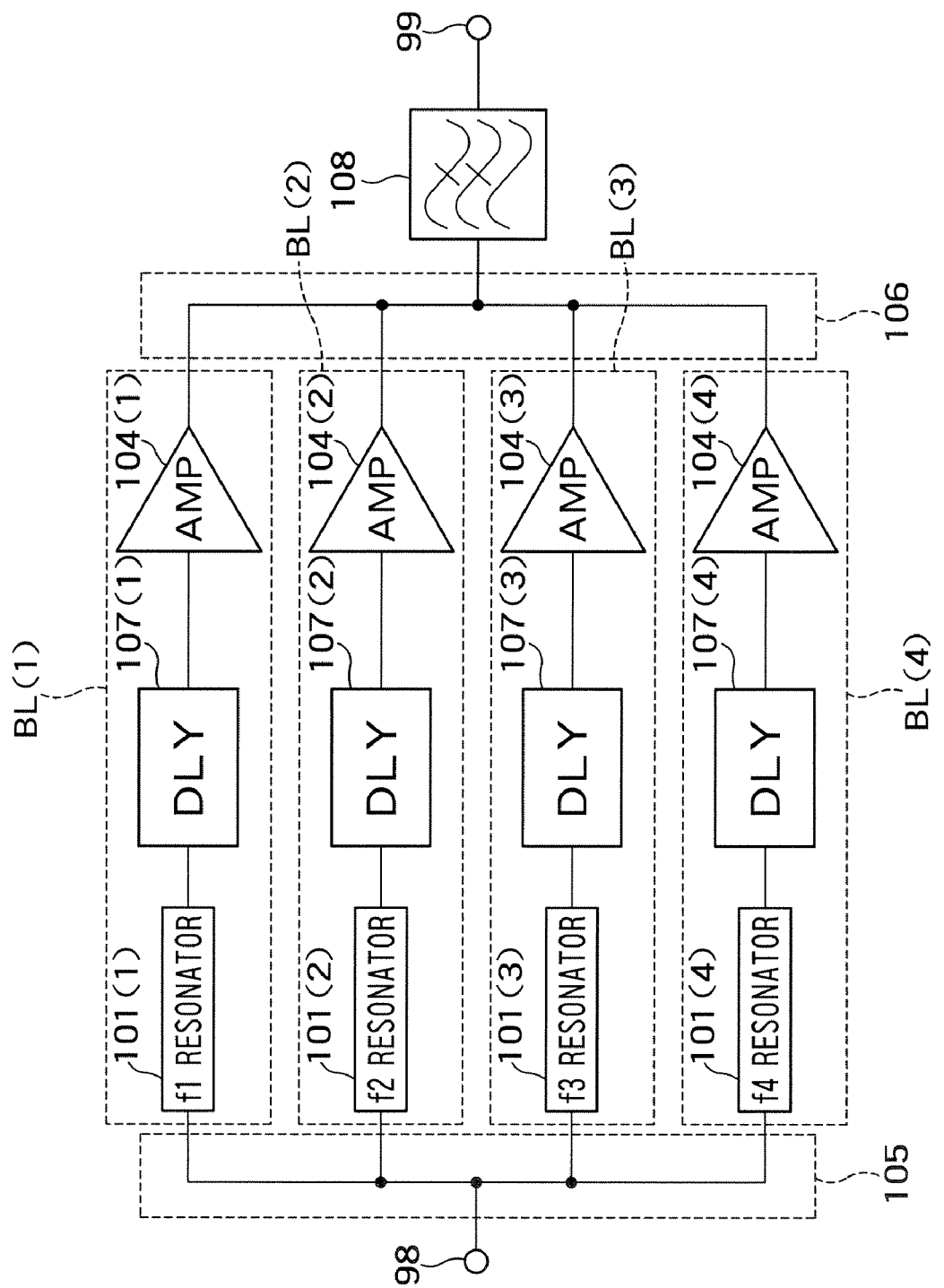
FIG. 15 is a block diagram showing another embodiment of the amplifying device of the present invention.

FIG. 15 shows a low pass filter 108 disposed after the power combiner 106 as a measure against harmonics generated at the amplifiers 104(1) to 104(4) in FIG. 14. By inputting a combined signal obtained from the power combiner 106 to the low pass filter 108, it is possible to cut harmonics generated at the respective amplifiers. Effects similar to those of the low pass filter can also be obtained by replacing the low pass filter by a band pass filter. It is of course possible to add a low pass filter or band pass filter to the configuration in FIG. 1.

Figure 16:
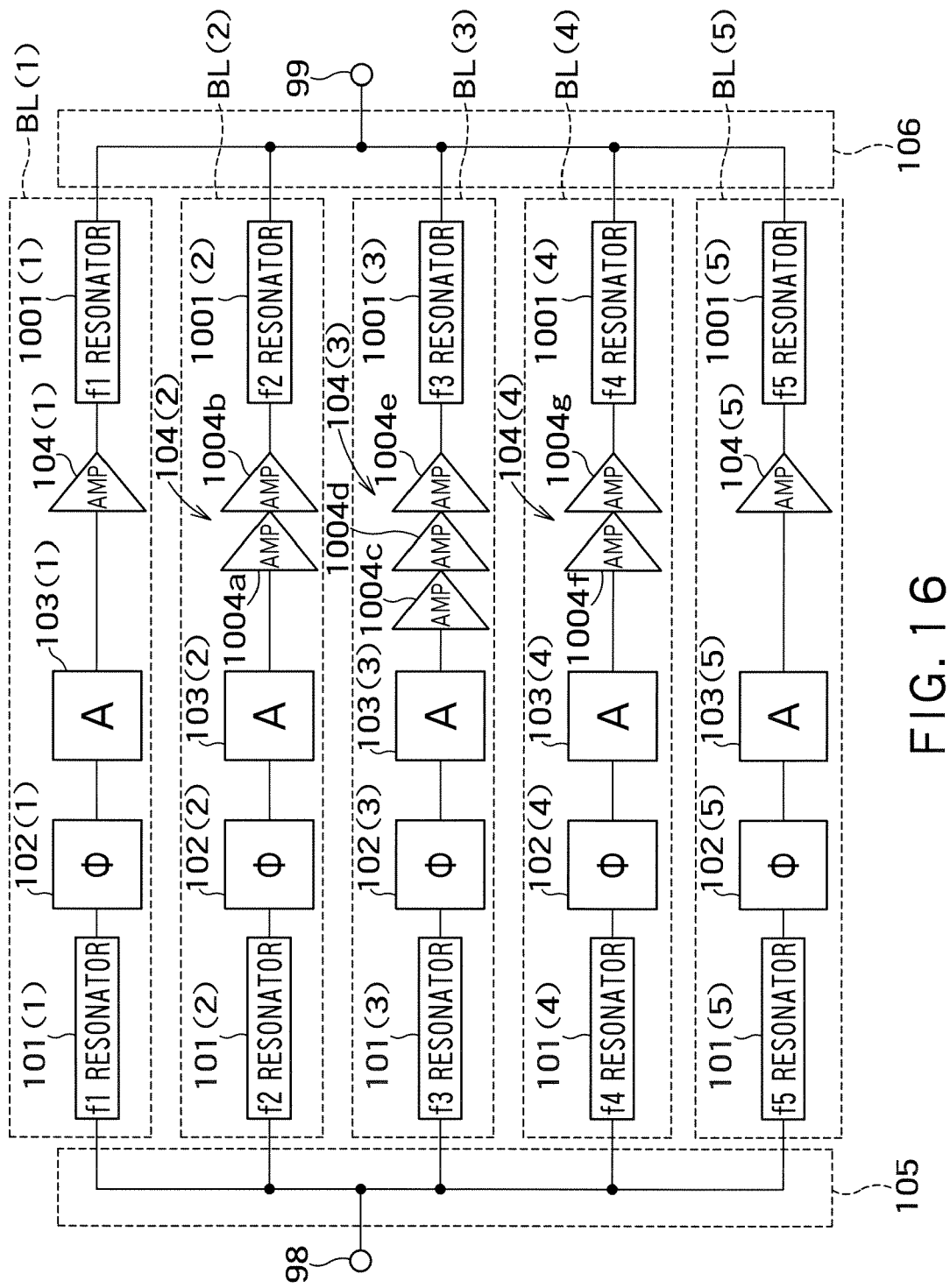
FIG. 16 is a block diagram showing a further embodiment of the amplifying device of the present invention.

FIG. 16 shows a third embodiment of the amplifying device according to the present invention.

An example where the number of amplification devices varies among the amplifiers 104(1) to 104(5) is shown. The amplifier 104(2) includes two cascade connected amplification devices 1004*a*, 1004*b*. The amplifier 104(3) includes three cascade connected amplification devices 1004*c*, 1004*d*, 1004*e*. The amplifier 104(4) includes two cascade connected amplification devices 1004*f*, 1004*g*. The amplifier 104(1) and amplifier 104(5) each include only a single amplification device. Generally, a modulated signal (communication signal) is occasionally a signal with energy uniformly distributed over a band as in FIG. 7 and is occasionally a signal having large energy near the center frequency and small energy at an end of the band. Thus, the numbers of amplification devices in the respective amplifiers 104(1) to 104(5) are determined according to the respective signal levels. This allows amplification devices in each block to be operated at optimum efficiency. This also makes it possible to reduce variable widths of variable amplitude sections 103(1) to 103(5).

Figure 17:
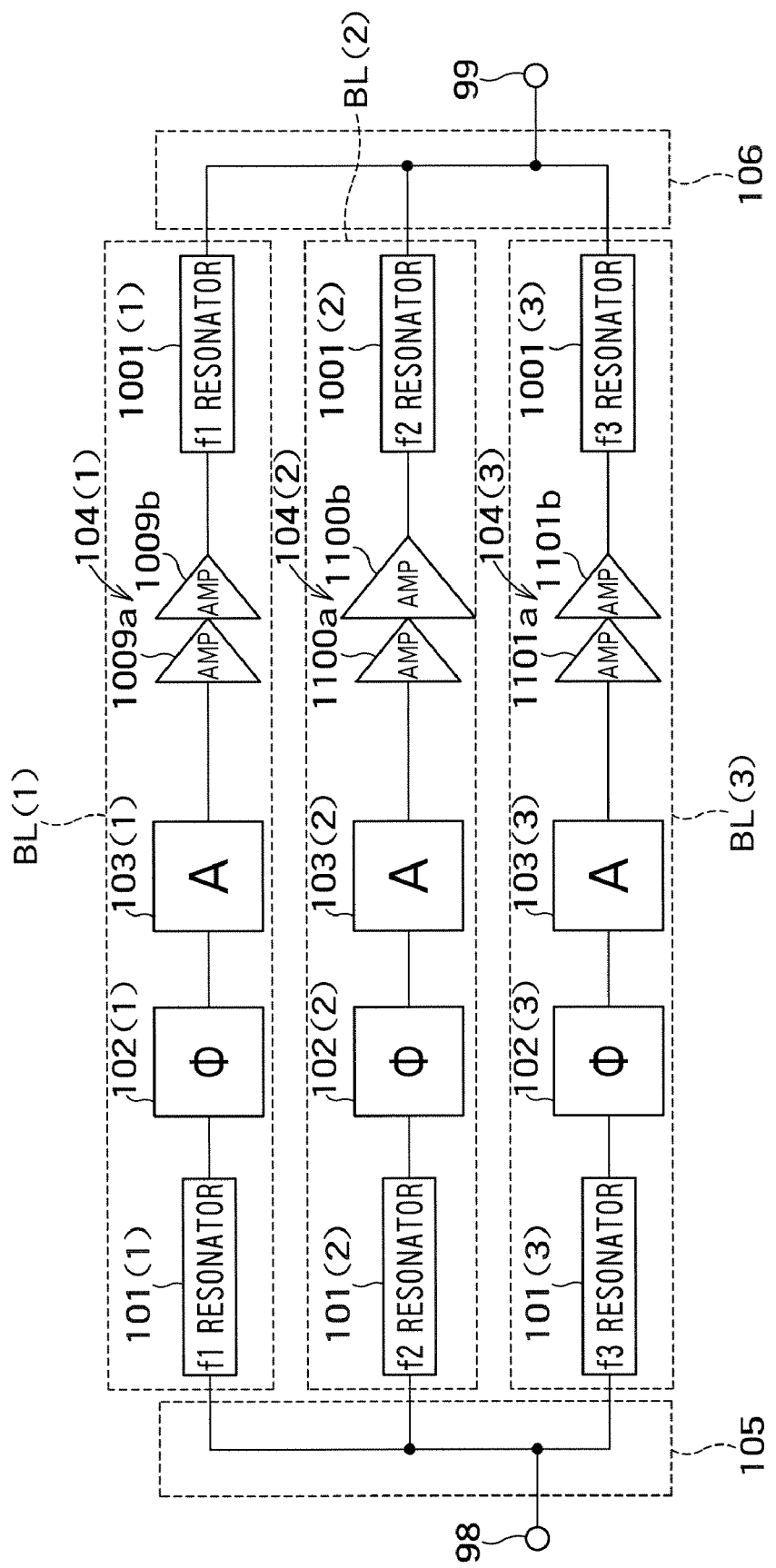
FIG. 17 is a block diagram showing a still further embodiment of the amplifying device of the present invention.

FIG. 17 shows an example where amplification devices (transistors) of different sizes (output power levels) are used at their respective amplifiers. More specifically, the final stage amplification devices differ in size from one amplifier to another. The amplifier 104(1) has two amplification devices 1009*a*, 1009*b* of the same size. The amplifier 104(2) has two amplification devices 1100*a*, 1100*b* of different sizes and the size of the posterior amplification device 1100*b* is greater than the sizes of the anterior amplification device 1100*a* and the amplification device 1009*b* of the amplifier 104(1). The amplifier 104(3) has two amplification devices 1101*a*, 1101*b* of the same size and the size of amplification device 1101*b* is smaller than the size of the amplification device 1100*b* of the amplifier 104(2). When the modulated signal (communication signal) is divided into a plurality of bands on the frequency axis by resonators 101(1) to 101(3) and the divided signals are amplified, large amplification energy is necessary for a wide band signal. Thus, by disposing an amplification device of appropriate size according to the size of the band of a signal or the size of a signal level in an amplifier, it is possible to operate the amplification device efficiently.

As explained using FIG. 16 and FIG. 17 above, it is possible to operate the amplifier efficiently by changing the number of amplification devices and the size thereof, for each amplifying device. This will be explained in further detail as follows.

Figure 18:
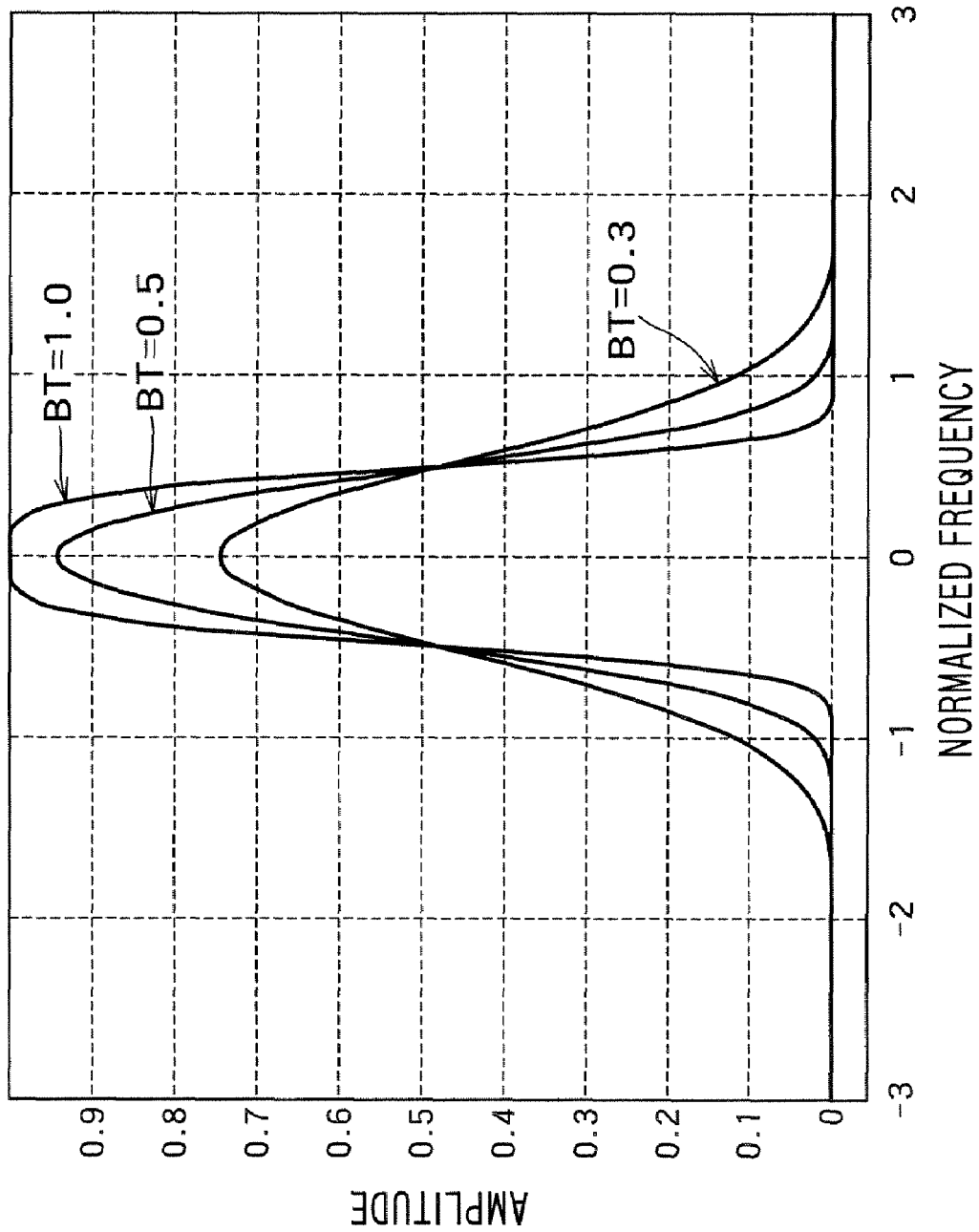
FIG. 18 illustrates a modulated signal when GFSK is used.

One of cellular phone systems used worldwide and centered in Europe at present is GSM (Global System for Mobile Communications). In GMSK (Gaussian filtered Minimum Shift Keying) which is the modulation scheme used by this GSM and GFSK (Gaussian filtered Frequency Shift Keying) used by Bluetooth (trademark), side lobes (band limiting) is cut using a Gaussian filter for narrow band transmission. For this reason, a distribution of modulated signal has a high energy density at the center frequency part. FIG. 18 shows an example of the modulated signal using GFSK. The horizontal axis shows normalized frequency, and zero of the horizontal axis is a center frequency. Signals with BT=0.3, BT=0.5, BT=1.0 are shown. "BT" (Bandwidth Time) denotes a normalized bandwidth of a Gaussian filter and means that the bandwidth broadens as the BT reduces. As the BT decreases between BT=1.0 and 0.5, the energy density increases in the center frequency part, and in BT<0.5, its relationship turns over. When a signal with BT=0.3 is used as an input signal to an amplifying device and divided on the frequency axis, there is a big difference in the output power level between the amplifier of a band near the center frequency and the amplifier of a band near the end. For this reason, if amplification is performed by amplification devices of the same size in each band, the efficiency of the amplifier in the band at the end deteriorates. Thus, it is possible to increase the overall amplification efficiency by performing amplification using amplification devices of different output power levels according to the energy distribution of a modulated signal. For example, when four resonators having the same coupling Q are used on the input side, the amplifiers in the blocks corresponding to the bands at both ends of the four split bands use amplification devices having approximately 80% of the output power level of the amplification devices used in amplifiers in other blocks.

Figure 19:
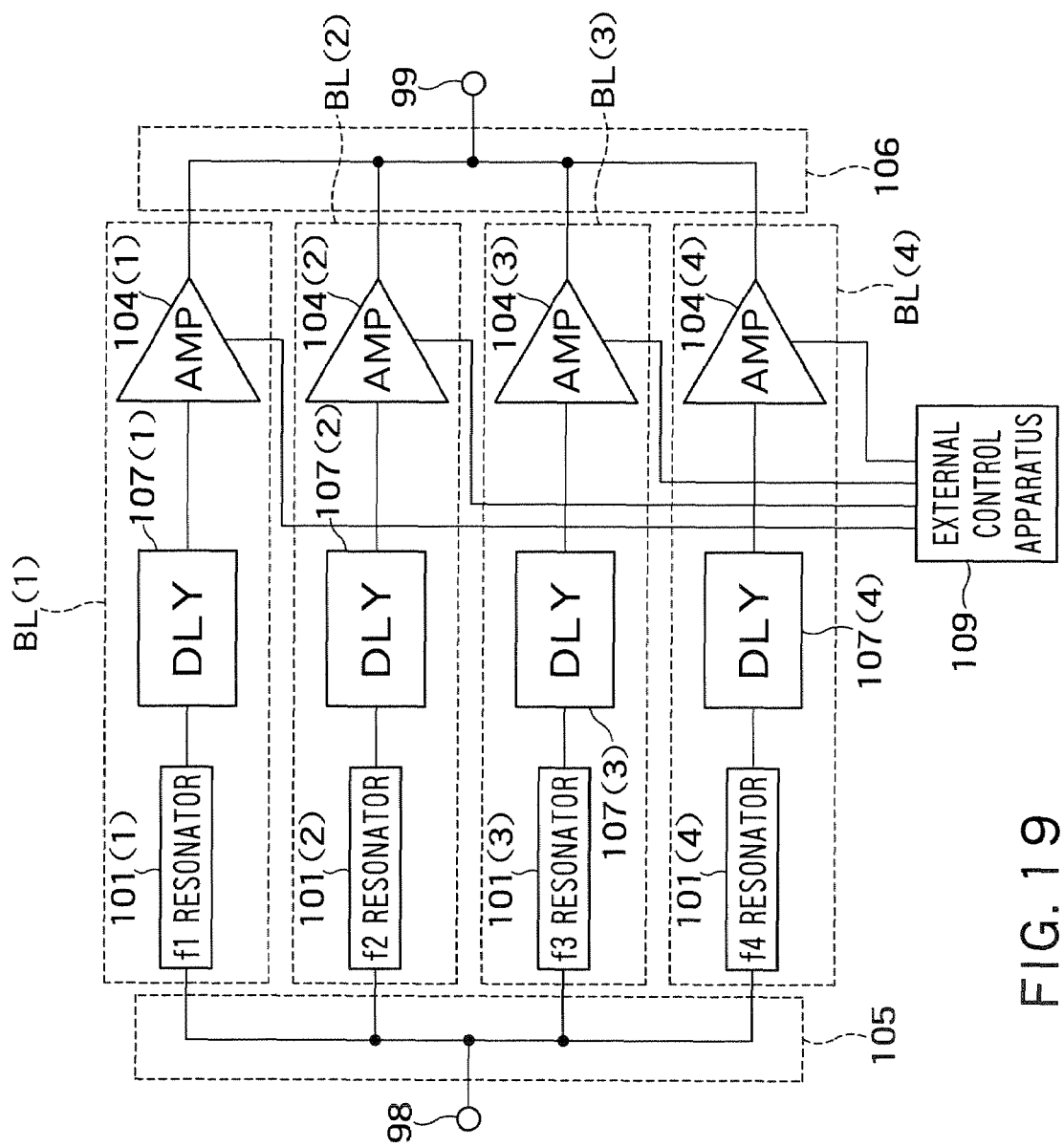
FIG. 19 is a block diagram showing a still further embodiment of the amplifying device of the present invention.

FIG. 19 shows a fourth embodiment of the amplifying device according to the present invention.

Figure 20:
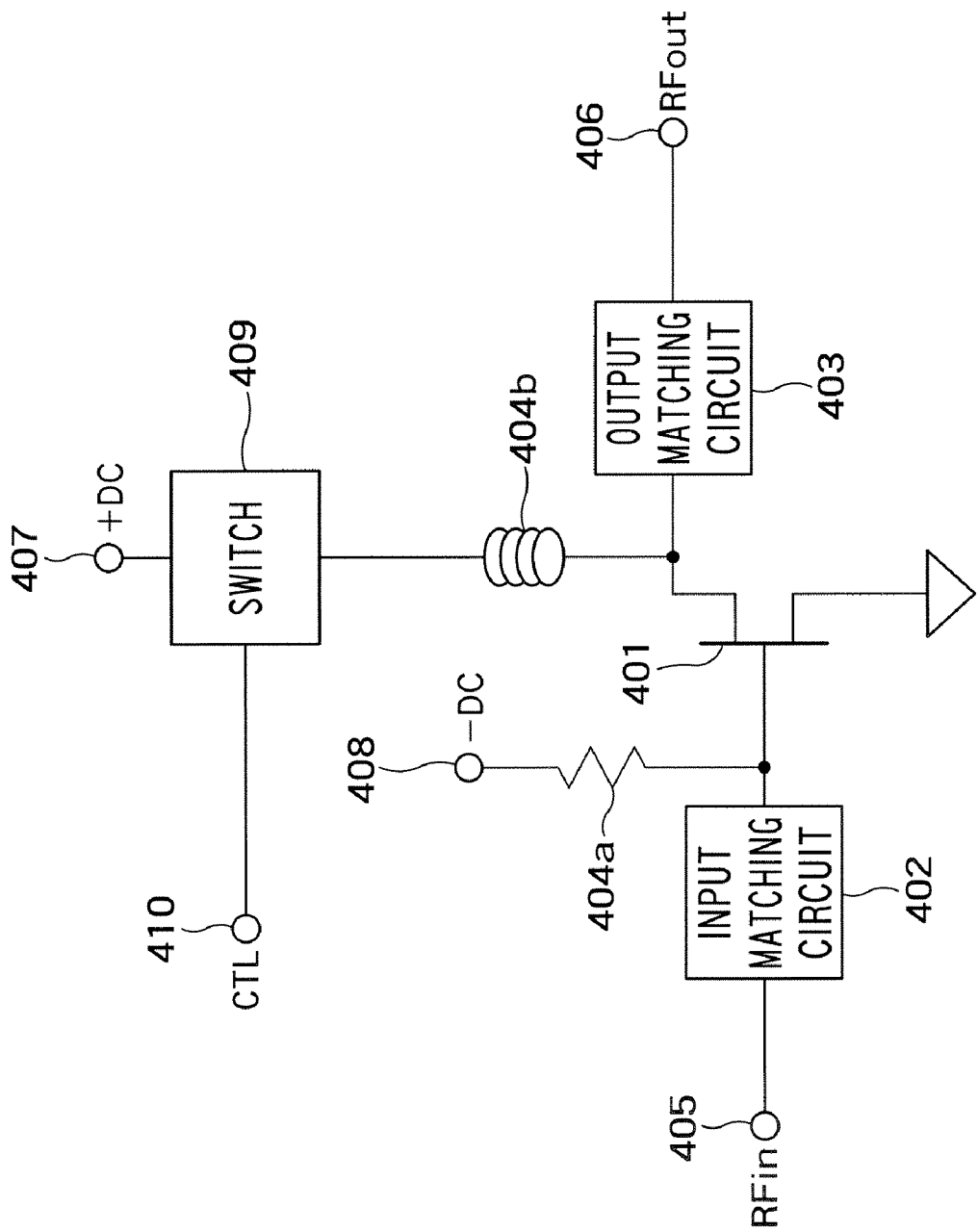
FIG. 20 is a circuit diagram showing a specific configuration example of the amplifier.
Figure 21:
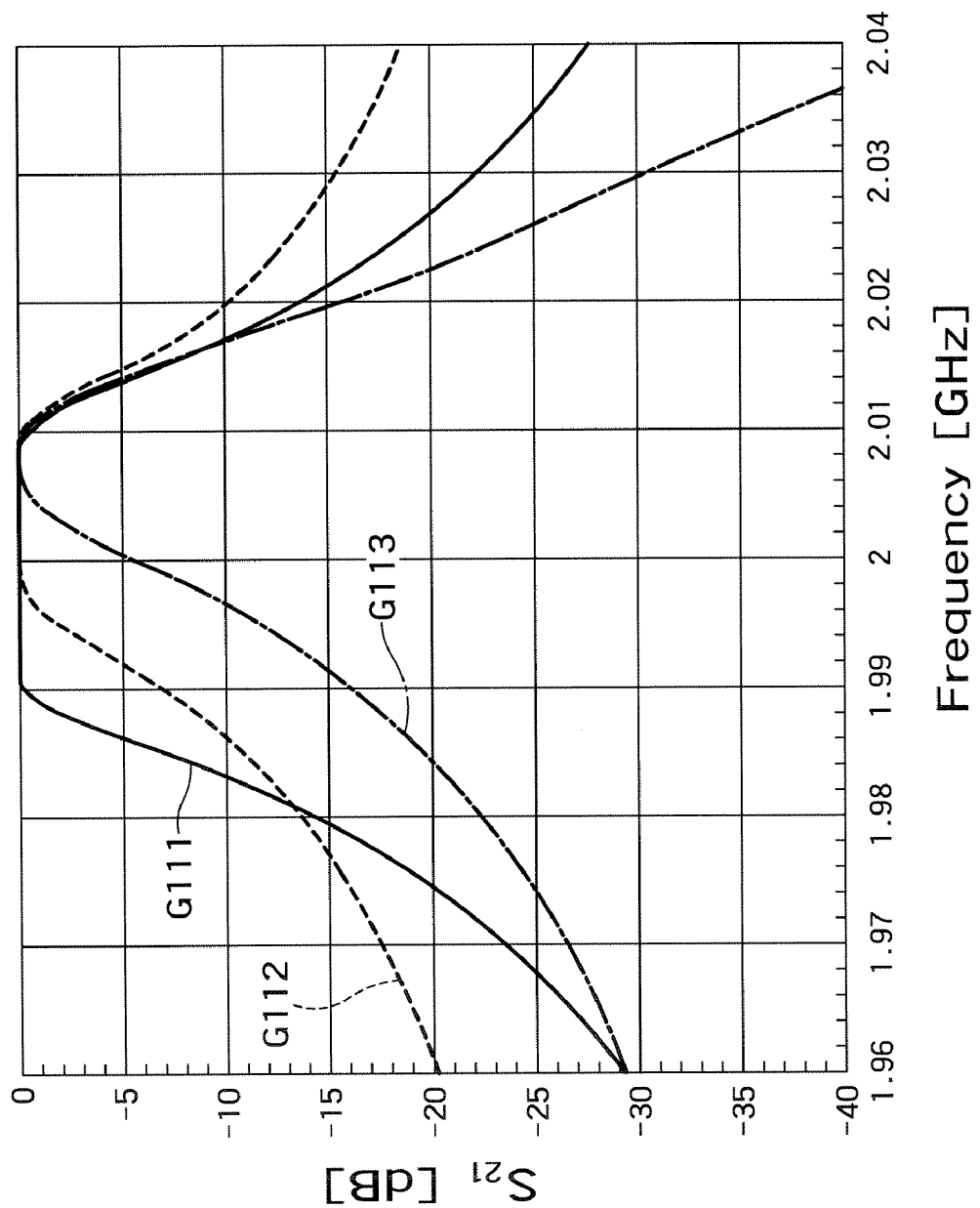
FIG. 21 illustrates an output frequency response characteristic of the embodiment shown in FIG. 19.

Amplifiers 104(1) to 104(4) include switching sections which switch ON/OFF (operating/non-operating state) the own operations. An external control apparatus 109 issues a control signal and in response to the control signal, amplifiers 104(1) to 104(4) switch the own operating states using the switching sections. FIG. 20 shows a configuration example of an amplifying device whose operating state can be changed. A switch 409 is provided between a drain terminal 407 and a bias circuit 404*b* as a switching section. A voltage (external control signal) given from the external control apparatus 109 to a control terminal 410 causes the switch 409 to switch ON/OFF a power supply from the drain terminal 407, and it is possible to thereby change the operating state of a field effect transistor 401. As other configuration, there is also another configuration in which the field effect transistor 401 is switched OFF by changing a negative voltage on the gate side to a value at which the field effect transistor 401 is placed in a pinch-off state. FIG. 21 shows a simulation result (passage characteristic) conducted while changing the number of amplifiers to be operated using the amplifying device shown in FIG. 19. The horizontal axis shows a frequency and the vertical axis shows an $S_{21}$ parameter. A simulation result when all the four amplifiers 104(1) to 104(4) are operated is shown with a graph G111, a simulation result when only the three amplifiers 104(2) to 104(4) are operated is shown with a graph G112 and a simulation result when only the two amplifiers 104(3), 104(4) are operated is shown with a graph G113. As is understandable from the graphs G111 to G113, it is possible to obtain a desired output signal by operating only necessary amplifiers in accordance with a signal band to be transmitted. That is, according to this configuration, it is also possible to maintain the operation at high efficiency for signals of different bandwidths.

Figure 22:
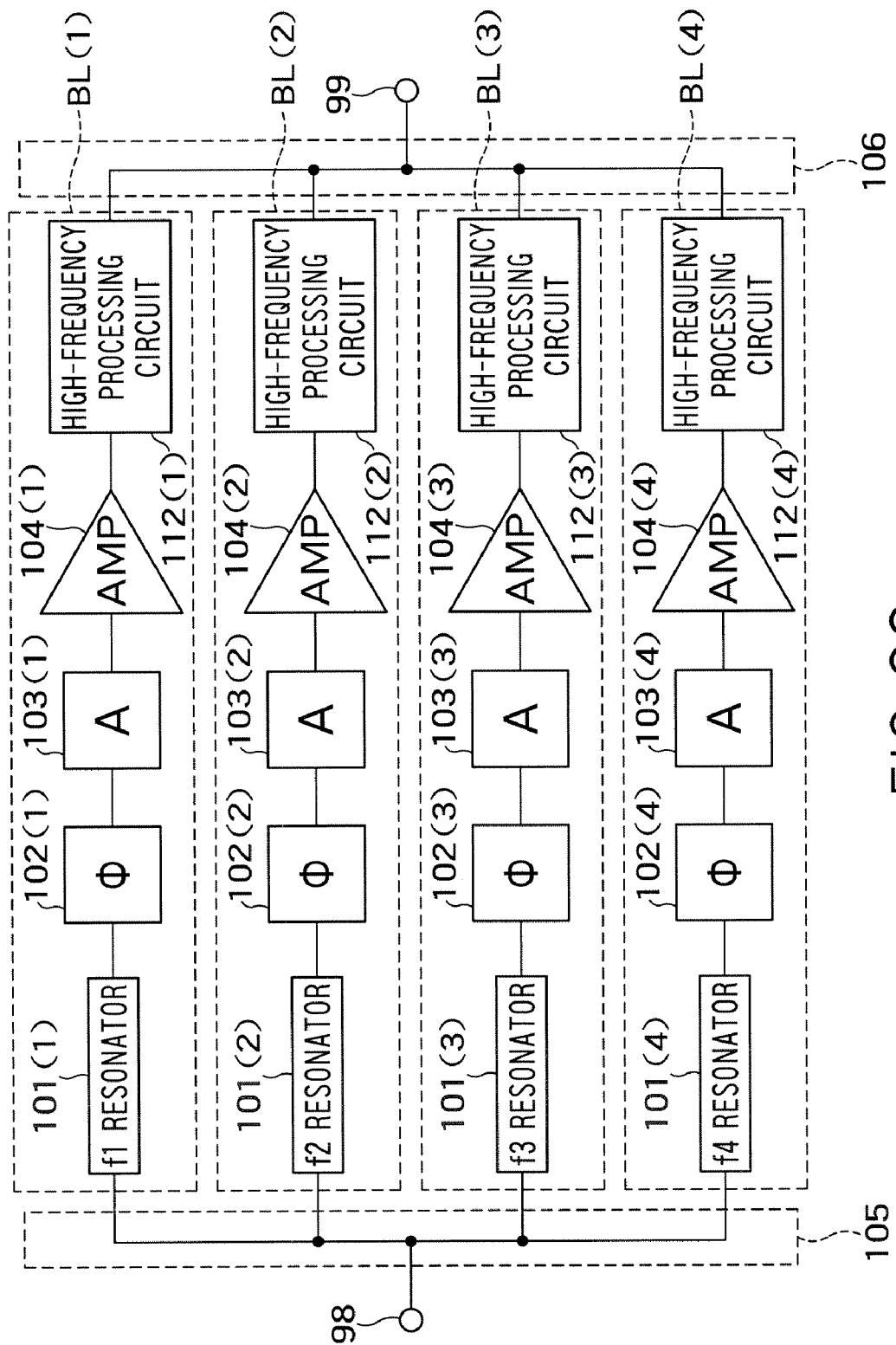
FIG. 22 is a block diagram showing a still further embodiment of the amplifying device of the present invention.

FIG. 22 shows a fifth embodiment of the amplifying device according to the present invention.

This amplifying device includes harmonics processing circuits 112(1) to 112(4) on the output side of amplifiers 104(1) to 104(4). Intermodulation distortion at the amplifiers 104(1) to 104(4) is reduced for the aforementioned reason, but signal energy clipped by the amplifiers 104(1) to 104(4) is outputted as harmonics. Thus, by providing the harmonics processing circuits 112(1) to 112(4) on the output side of the amplifiers 104(1) to 104(4), it is possible to increase the efficiency of the amplifiers 104(1) to 104(4). As an example of the harmonics processing circuit, it is possible to realize a circuit which performs a class F operation by shorting even harmonics and leaving open odd harmonics, and ideally it is possible to realize efficiency of 100%. By connecting such a circuit to the output side of each amplifier, it is possible to operate each amplifier with high efficiency.

Figure 23:
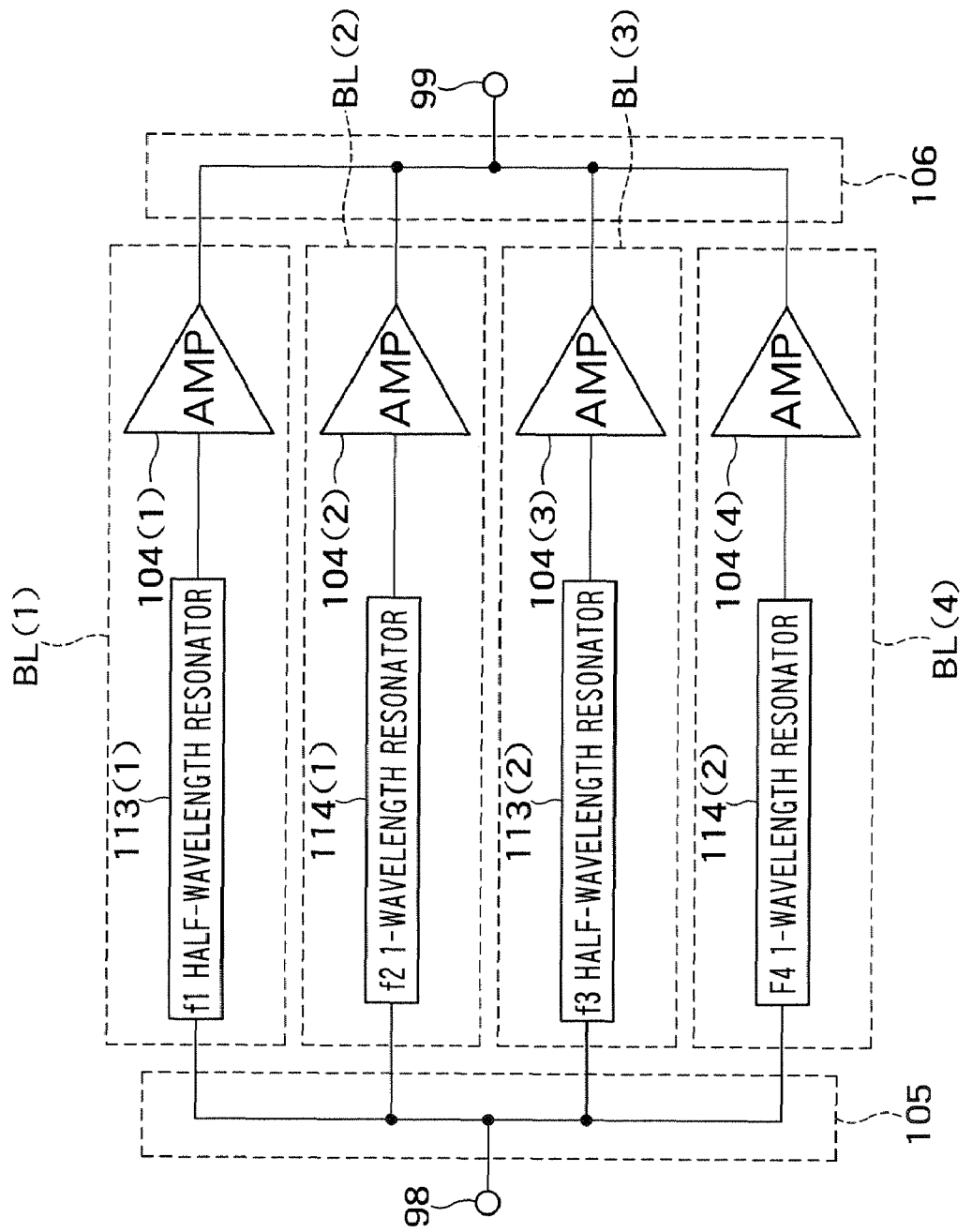
FIG. 23 is a block diagram showing a still further embodiment of the amplifying device of the present invention.

FIG. 23 shows a sixth embodiment of the amplifying device according to the present invention.

In this amplifying device, each resonator includes delay means. Resonators of neighboring resonance frequencies are a (0.5+K) wavelength (K: an integer of 0 or greater) resonator and an L wavelength (L: an integer of 1 or greater) resonator. FIG. 23 shows an example where K=0, L=1. Here, a resonator 113(1) is a half-wavelength resonator having a transmission line having the half-wavelength of its resonance frequency f1, a resonator 114(1) is a 1-wavelength resonator having a transmission line having the 1-wavelength of its resonance frequency f2, a resonator 113(2) is a half-wavelength resonator having a transmission line having the half-wavelength of its resonance frequency f3 and a resonator 114(2) is a 1-wavelength resonator having a transmission line having the 1-wavelength of its resonance frequency f4. When neighboring resonators satisfy the above described conditions related to K and L, each resonator may has an arbitrary transmission path length. For example, the resonator 113(1) may be a 0.5-wavelength resonator. the resonator 114(1) may be a 1-wavelength resonator. Or, the resonator 113(1) may be a 1.5-wavelength resonator and the resonator 114(2) may be a 2-wavelength resonator.

Using FIG. 24 and FIG. 25, an example where the amplifying device explained so far (FIG. 1, FIG. 14, FIG. 15, FIG. 16, FIG. 17, FIG. 19, FIG. 22, FIG. 23) is incorporated in a radio communication device will be explained.

Figure 24:
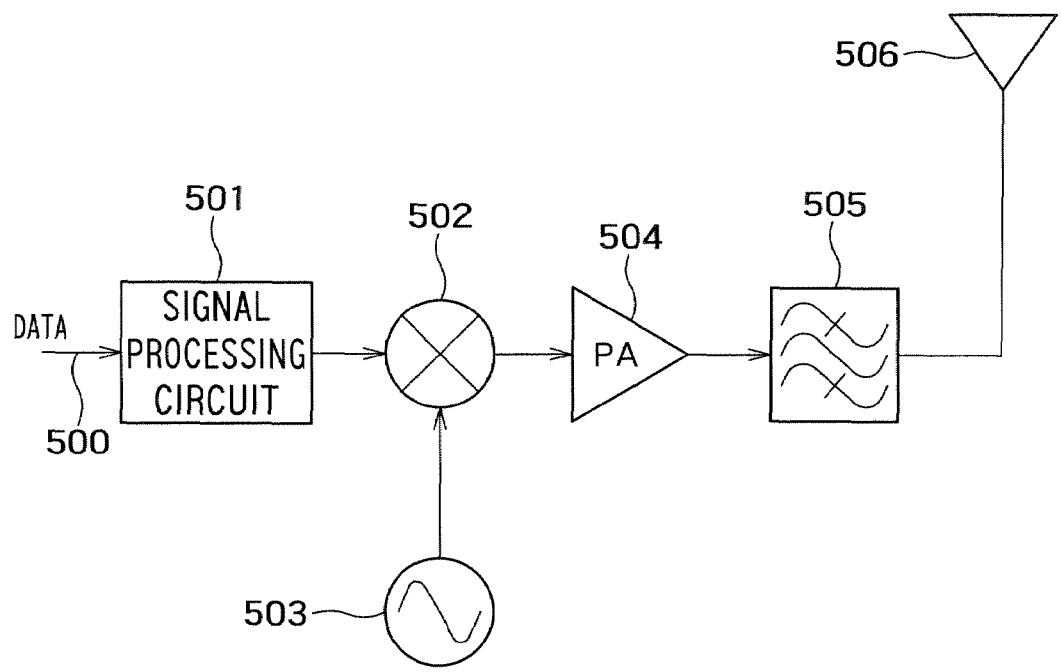
FIG. 24 illustrates a configuration example when the amplifying device according to an embodiment of the present invention is applied to a transmission section of a radio communication device.

FIG. 24 schematically shows a configuration example of a transmission section in a radio communication device. Data to be transmitted 500 is inputted to a signal processing circuit 501, subjected to transmission processing such as digital/analog conversion, coding and modulation, and thereby a transmission signal having a baseband or intermediate frequency (IF) band is generated. The transmission signal generated at the signal processing circuit 501 is inputted to a frequency converter (mixer) 502, multiplied by a local signal from a local signal generator 503, and thereby converted to a signal of a radio frequency (RF) band, that is, up-converted. The RF signal outputted from the mixer 502 is amplified by a power amplifier (PA) 504 as an amplifying device according to this proposal and then inputted to a band limiting filter (transmission filter) 505. The RF signal amplified by the power amplifier 504 is limited in band at this filter 505, deprived of an unnecessary frequency component and then radiated from an antenna 506 into space as a radio wave. If an unnecessary frequency component can be eliminated in the amplifier 504 according to this proposal, the band limiting filter 505 may not be provided.

Figure 25:
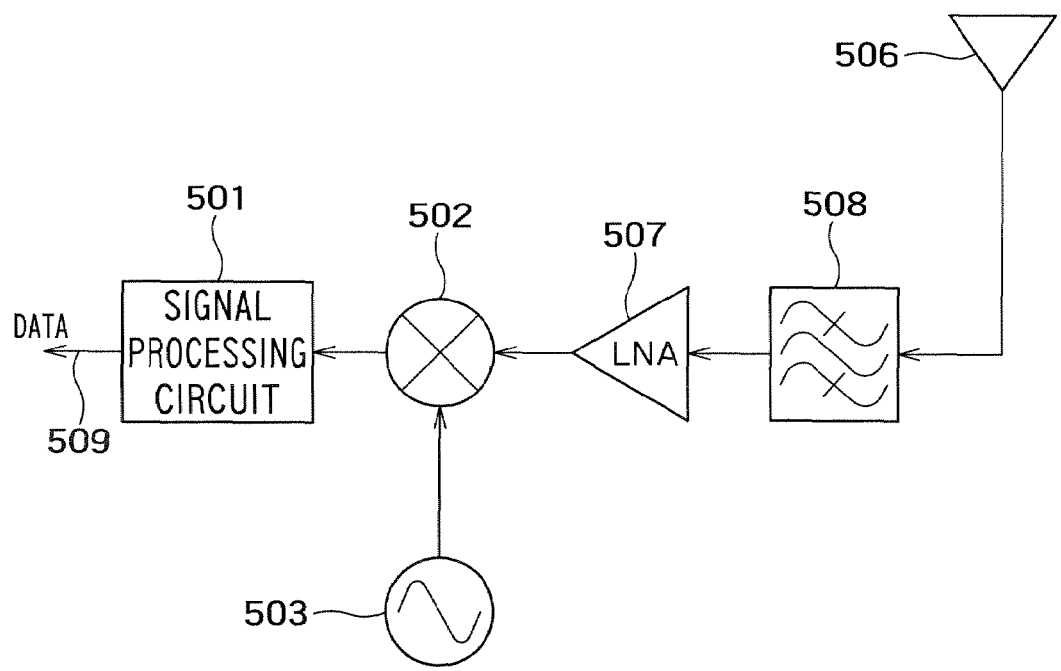
FIG. 25 illustrates a configuration example when the amplifying device according to an embodiment of the present invention is applied to a reception section of the radio communication device.

FIG. 25 schematically shows a configuration example of a reception section in a radio communication device. A signal received through an antenna 506 is inputted to a band limiting filter (reception filter) 508, limited in band at this reception filter 508, deprived of an unnecessary frequency component and then inputted to a low noise amplifier (LNA) 507 as an amplifying device according to this proposal. The signal amplified by the low noise amplifier 507 is inputted to a mixer 502, multiplied by a local signal from a local signal generator 503 and thereby converted to a baseband or intermediate frequency. The signal converted to a low frequency through this conversion is inputted to a signal processing circuit 501, subjected to demodulation processing, and thereby received data 509 is outputted. If an unnecessary frequency component can be eliminated at the low noise amplifier (LNA) 507, the band limiting filter 508 may not be provided.

Figure 26:
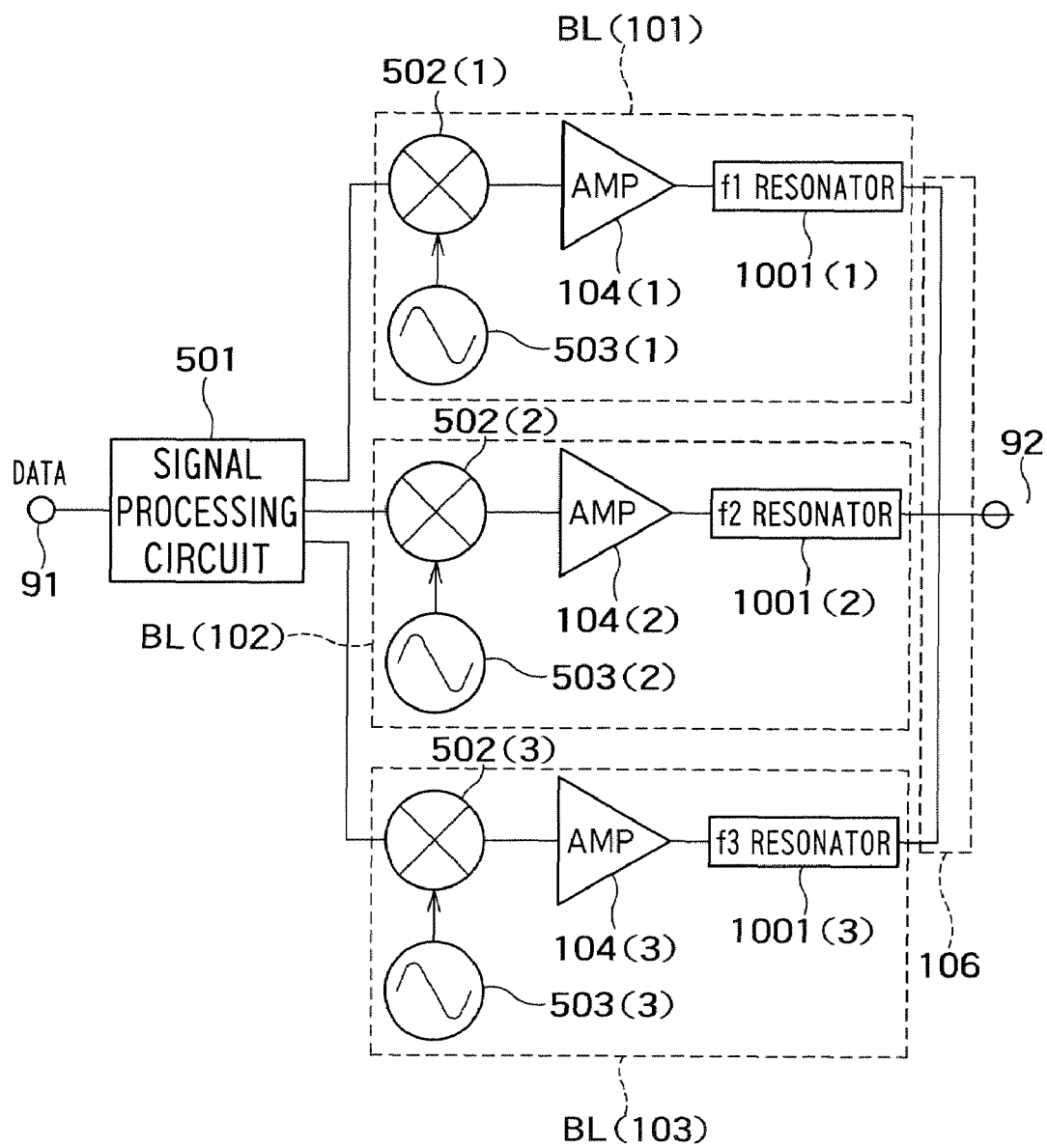
FIG. 26 is a block diagram showing an embodiment of a radio communication circuit of the present invention.

FIG. 26 shows an embodiment of a radio communication circuit according to the present invention.

This radio communication circuit is provided with an input terminal 91, a signal processing circuit 501, blocks BL(101) to BL(103), a power combiner 106 and an output terminal 92. The blocks BL(101) to BL(103) have mixers 502(1) to 502(3), oscillators 503(1) to 503(3), amplifiers 104(1) to 104(3) and resonators 1001(1) to 1001(3). The blocks BL(101) to BL(103) are connected to the signal processing circuit 501 in parallel on the input side. The blocks BL(101) to BL(103) are connected to the power combiner 106 in parallel on the output side.

The signal processing circuit 501 performs transmission processing such as digital/analog conversion, coding and modulation to the data inputted from the input terminal 91, and thereby generates a transmission signal of a baseband or intermediate frequency (IF) band and divides (distributes) the transmission signal generated for the blocks BL(101) to BL(103). For example, the signals given to the respective blocks (101) to BL(103) are the same.

Figure 27:
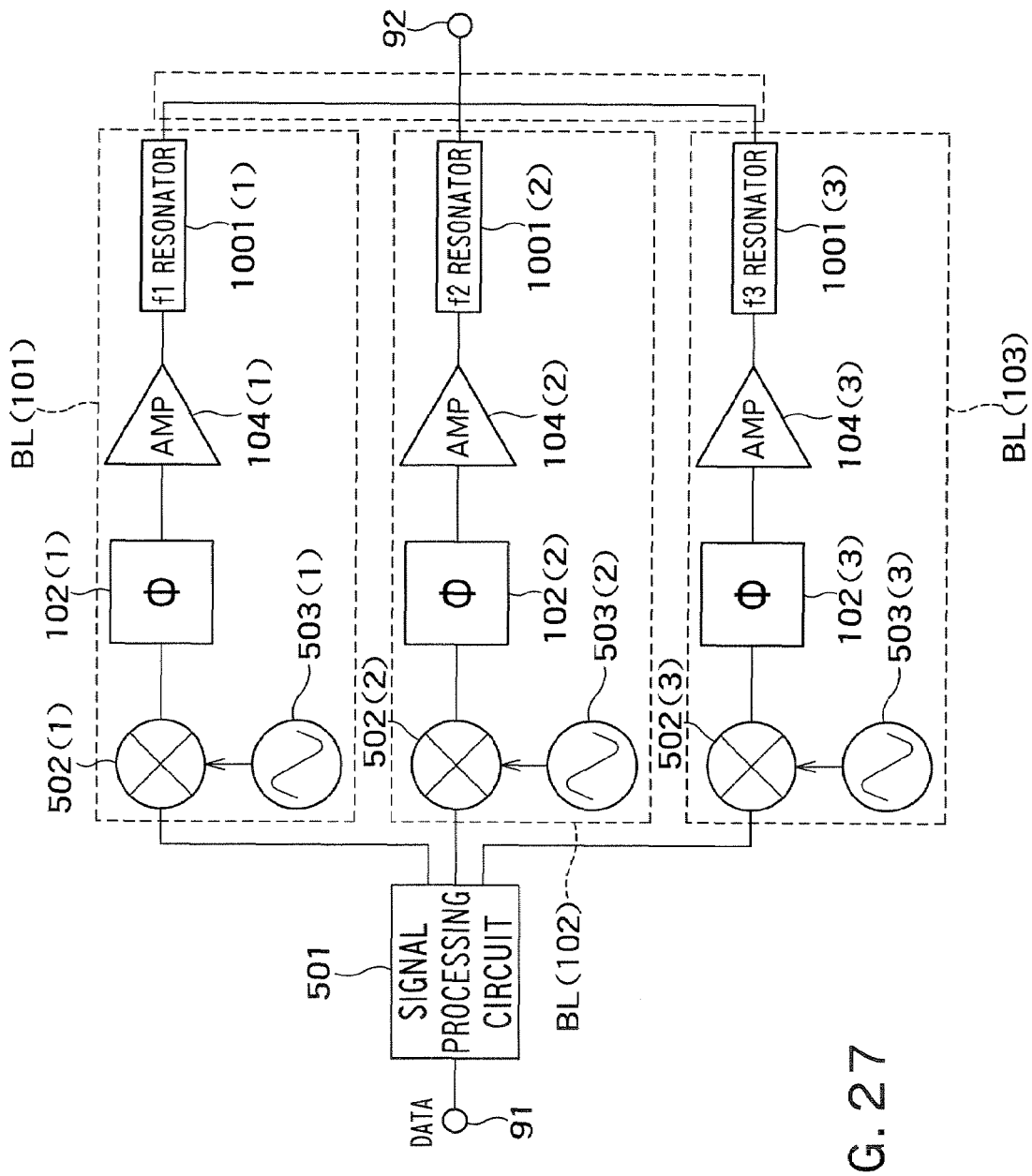
FIG. 27 is a block diagram showing another embodiment of the radio communication circuit of the present invention.

The mixers 502(1) to 502(3) in the blocks BL (101) to BL (103) up-convert the signals given from the signal processing circuit 501 using a reference signal from the oscillators 503(1) to 503(3) to a radio frequency (RF) band. The signals of the respective radio frequencies are amplified by the amplifiers 104(1) to 104(3) and then given to the resonator 1001(1) to resonator 1001(3). Here, the oscillating frequencies of the oscillators 503(1) to 503(3) are the same as the resonance frequencies of the resonators 1001(1) to 1001(3). That is, all the oscillating frequencies of the oscillators 503(1) to 503(3)

are different. Furthermore, due to the placement of the resonators 1001(1) to 1001(3), the signals which have passed through the respective blocks of neighboring resonance frequencies need to have a phase difference within a range of $(180\pm30)+360\times n$ degrees (n: an integer of 0 or greater) of the same amplitude at a power combination point of the power combiner 106. For this reason, the oscillators 503(1) to 503(3) are made to oscillate with the amplitude and phase that satisfy such a condition. If the oscillators 503(1) to 503(3) are oscillated with the same phase, for example, as shown in FIG. 27, variable phase sections 102(1) to 102(3) for adjusting the phases need to be placed between the mixers 502(1) to 502(3) and amplifiers 104(1) to 104(3). A delay circuit may also be used as the variable phase section.

The resonators 1001(1) to 1001(3) extract signals according to the own resonance frequencies from the signals given from the amplifiers 104(1) to 104(3) and give them to the power combiner 106. In this case, distortion resulting from non-linearity of active elements at the mixers 502(1) to 502(3) and amplifiers 104(1) to 104(3) are removed at the resonators 1001(1) to 1001(3) and the signals rid of distortion are given to the power combiner 106.

The power combiner 106 combines the signals given from the resonators 1001(1) to 1001(3) to acquire a combined signal and outputs the combined signal acquired from an output terminal 92. The combined signal outputted from the output terminal 92 is radiated into a space as an electric wave from an antenna (see FIG. 24). The combined signal may be radiated from the antenna after passing through a filter. It is a great feature which is different from the configuration in FIG. 24 that the distortion generated at the time of the frequency conversion by the mixers 502(1) to 502(3) is removed by the resonators 1001(1) to 1001(3) and not superimposed on the output signal.

Figure 28:
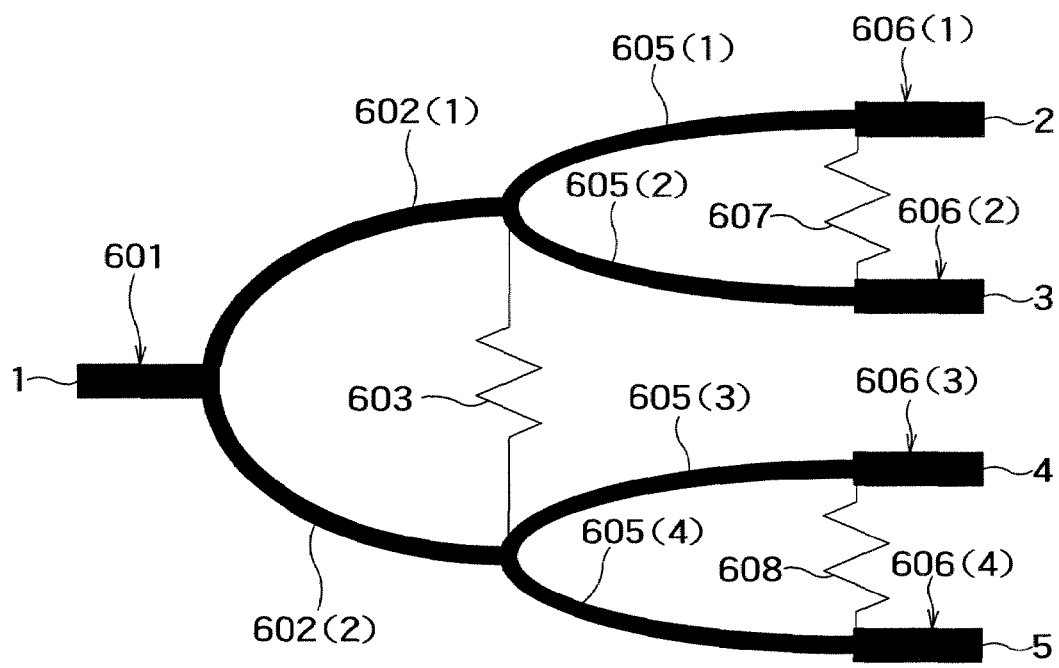
FIG. 28 illustrates a configuration example of a power divider.

FIG. 28 shows a 4-fold divider made up of two stages of 2-fold division Wilkinson type dividers using micro strip lines as a configuration example of the power divider 105.

An input port 1 is provided at one end of a 50-ohm line 601 and one end of two 70.7-ohm 1/4-wavelength lines 602(1), 602(2) is connected to the other end of the 50-ohm line 601. The other ends of the lines 602(1), 602(2) are connected each other by a 50-ohm resistor 603, which constitutes a 2-fold divider. A 4-fold divider is realized by connecting these 2-fold dividers in two stages. One end of the 50-ohm lines 606(1) to 606(4) is connected to 1/4-wavelength lines 605(1) to 605(4) in the second stage and output ports 2 to 5 are provided at the other ends of 50-ohm lines 606(1) to 606(4). Reference numerals 607, 608 denote 50-ohm resistors. Assuming that reference numerals 2 to 5 mean input ports and 1 mean an output port, the configuration shown in FIG. 28 can be used as a combiner.

Figure 29:
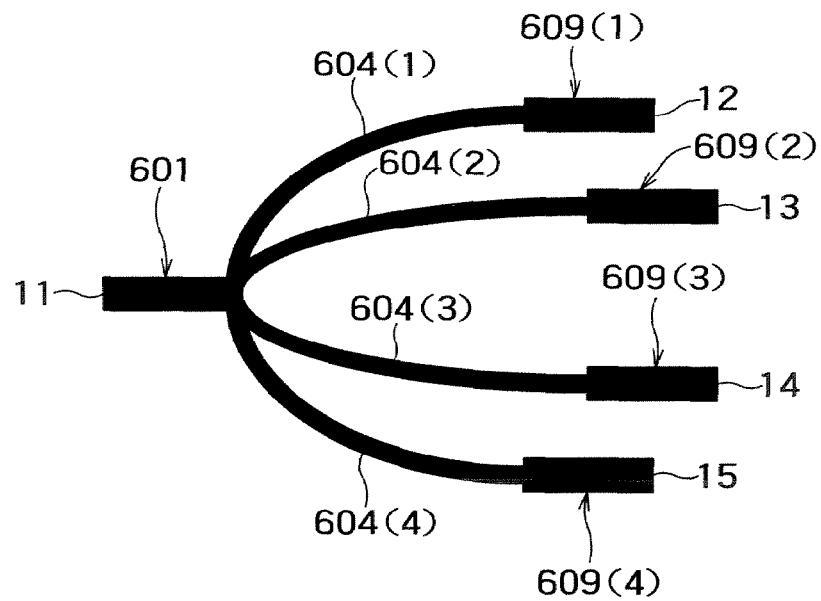
FIG. 29 illustrates another configuration example of the power divider.

FIG. 29 shows a configuration example of a low-loss-oriented 4-fold divider at the sacrifice of an isolation characteristic.

An input port 11 is provided at one end of a 50-ohm line 601, one end of each of four 100-ohm 1/4-wavelength lines 604(1) to 604(4) is connected to the other end of the 50-ohm line 601. 50-ohm lines 609(1) to 609(4) are connected to the other ends of the lines 604(1) to 604(4). Output ports 12 to 15 are provided on the output side of the 50-ohm lines 609(1) to 609(4).

Figure 30:
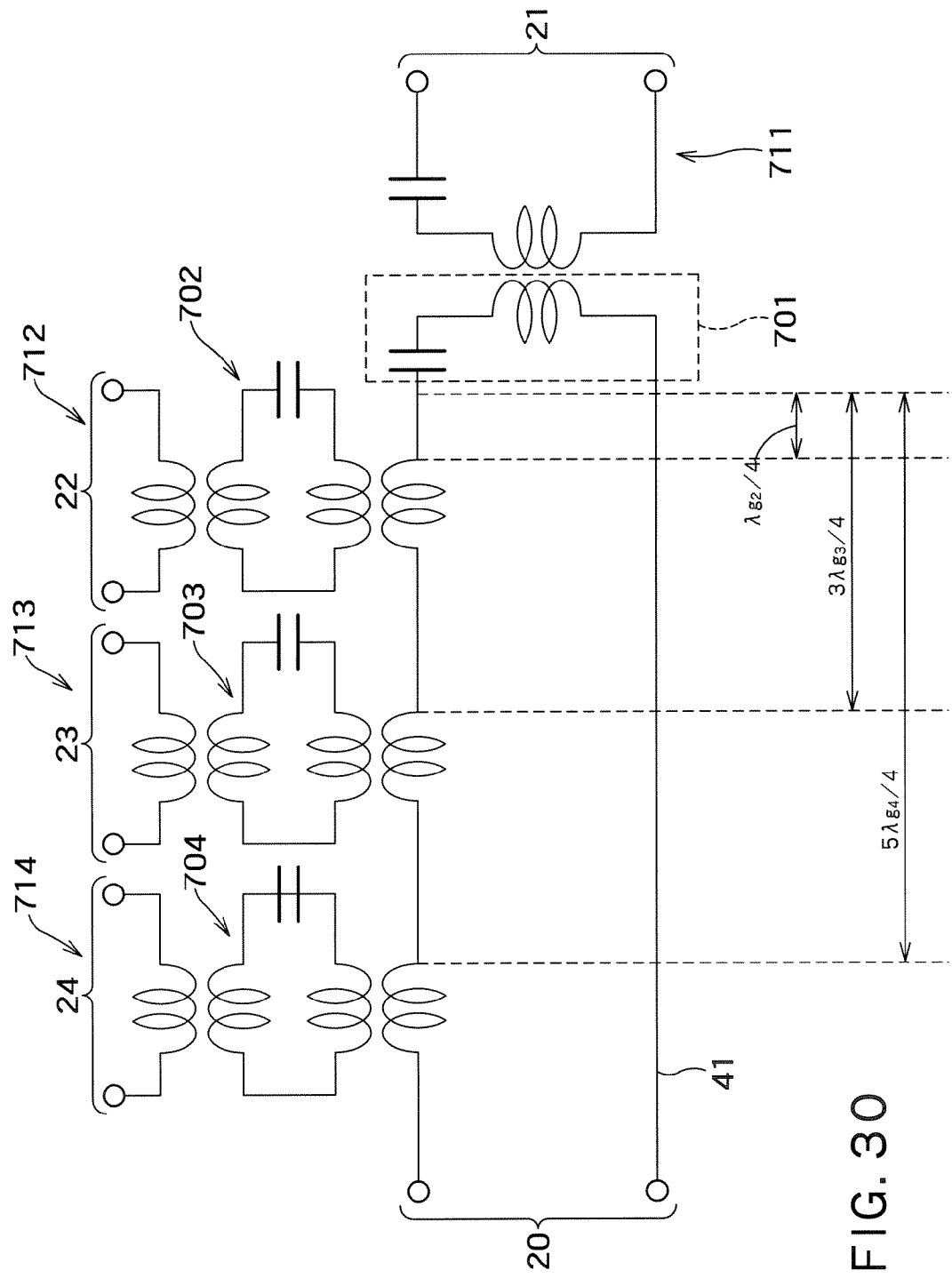
FIG. 30 illustrates a configuration example of a branching filter.

FIG. 30 shows a configuration example where branching filters are used for the power divider 105 and resonance circuits 101(1) to 101($i$) (assuming i=4) in FIG. 1.

A branching circuit 41 includes a resonance circuit 701 (corresponds to the resonator 101(1) in FIG. 1) which resonates at a resonance frequency f1 at a termination section. The resonance circuit 701 resonates based on a signal inputted from ports 20 and the resonance signal is outputted from ports 21 through a coupling circuit 711 (corresponds to the coupling circuit which couples the resonator 101(1) and variable phase section 102(1) in FIG. 1). A resonator 702 (corresponds to the resonator 102(2) in FIG. 1) of a resonance frequency f2 is coupled with the branching circuit 41 at a position shifted from the position of the resonance circuit 701 of the resonance frequency f1 by 1/4 wavelength ($\lambda_{g2}/4$) of the resonance frequency f2. The resonator 702 is coupled with a coupling circuit 712 (corresponds to the coupling circuit which couples the resonator 101(2) with the variable phase section 102(2) in FIG. 1) and the resonance signal at the resonator 702 is outputted from ports 22 through the coupling circuit 712. Likewise, a resonator 703 of a resonance frequency f3 is coupled with the branching circuit 41 at a position shifted from the position of the resonance circuit 701 by 3/4 wavelength ($3\lambda_{g3}/4$) of the resonance frequency f3. The resonator 703 is coupled with a coupling circuit 713 (corresponds to the coupling circuit which couples the resonator 101(3) with the variable phase section 102(3) in FIG. 1) and the resonance signal at the resonator 703 is outputted from ports 23 through the coupling circuit 713. A resonator 704 of a resonance frequency f4 is coupled with the branching circuit 41 at a position shifted from the position of the resonance circuit 701 by 5/4 wavelength ($5\lambda_{g4}/4$) of the resonance frequency f4. The resonator 704 is coupled with a coupling circuit 714 and the resonance signal at the resonator 704 is outputted from ports 24 through the coupling circuit 714.

What is claimed is:

1. An amplifying device comprising:
    an input terminal configured to input an input signal having a band signal to be amplified;
    first to ith blocks including a single resonator and an amplifier wherein each single resonator of the first to ith blocks has first to ith resonance frequencies (first resonance frequency<second resonance frequency<...<ith resonance frequency) included within a band of the band signal to be amplified and extracts a signal having the resonance frequency of each single resonator as a center frequency from the band signal, and each amplifier of the first to ith blocks amplifies a signal extracted by each single resonator;
    a divider configured to divide the input signal having the band signal to be amplified for each resonator of the first to ith blocks;
    a combination section configured to combine the signals which have passed through the first to ith blocks to obtain a combined signal; and
    an output terminal configured to output the combined signal,
    wherein a jth (j: an integer between 1 and i−1) block includes a phase adjustment section which provides an output signal of the jth block with a phase difference within a range of $\{(180\pm30)+(360\times n)\}$ degrees (n: an integer of 0 or greater) from an output signal that passes through a (j+1)th block.

2. The amplifying device according to claim 1, wherein the jth block includes a delay circuit as the phase adjustment section.

3. The amplifying device according to claim 2, wherein the (j+1)th block includes a phase adjustment section which provides an output signal of the (j+1)th block with a phase difference within a range of $\{(180\pm30)+(360\times n)\}$ degrees (n: an integer of 0 or greater) from an output signal that passes through the jth block.

4. The amplifying device according to claim 3, wherein the (j+1)th block includes a delay circuit as the phase adjustment section.

5. The amplifying device according to claim 1, wherein each of the first to ith blocks includes another resonator after the amplifier, which has the same resonance frequency as that of the single resonator in each of the first to ith blocks.

6. The amplifying device according to claim 1, wherein the first to ith blocks further includes switching sections which switch ON/OFF the amplifiers in the first to ith blocks in accordance with a band of the band signal to be amplified.

7. The amplifying device according to claim 1, wherein the first to ith blocks further includes amplitude adjustment sections which adjust amplitudes of signals that pass through the first to ith blocks.

8. The amplifying device according to claim 7, wherein the amplifier is an sth (s: an integer between 1 and i) block has m cascade connected amplification devices and the amplifier in a tth (t: an integer between 1 and i) block has n (≠m) cascade connected amplification devices.

9. The amplifying device according to claim 7, wherein the amplifier in an sth (s: an integer between 1 and i) block and the amplifier in a tth (t: an integer between 1 and i) block have amplification devices of different sizes.

10. The amplifying device according to claim 1, wherein a degree of coupling of the resonator in an sth (s: an integer between 1 and i) block is different from a degree of coupling of the resonator in a tth (t: an integer between 1 and i) block.

11. The amplifying device according to claim 1, wherein conductive parts of resonators in the first to ith blocks are made of a superconductor.

12. A radio communication circuit comprising:
an input terminal configured to input transmission data;
first to ith blocks;
a signal processing circuit configured to perform transmission processing on the transmission data to generate transmission signal and divide the transmission signal for the first to ith blocks;
a power combination section configured to combine signals that have passed through the first to ith blocks to obtain a combined signal; and
an output terminal configured to output the combined signal,
wherein the first to ith blocks each include:
a frequency converter configured to convert a frequency of a signal that passes through each of the first to ith blocks;
an oscillator configured to give a reference signal to the frequency converter wherein each reference signal has first to ith frequencies (first frequency<second frequency< . . . <ith frequency) included within a band of the transmission signal;
an amplifier configured to amplify a signal that passes through each of the first to ith blocks; and
a single resonator configured to have a resonance frequency of the same frequency as each of the first to ith frequencies and extract a signal having each of the first to ith frequencies as a center frequency from an amplified signal by each amplifier,
wherein the oscillators in jth (j: an integer between 1 and i−1) and (j+1)th blocks give reference signals having different phases to the frequency converters in the jth and (j+1)th blocks to provide the signals that pass through the jth and (j+1)th blocks with phase differences within a range of {(180±30)+(360×n)} degrees (n: an integer of 0 or greater).

13. A radio communication circuit comprising:
an input terminal configured to input transmission data;
first to ith blocks;
a signal processing circuit configured to perform transmission processing on the transmission data to generate transmission signal and divide the transmission signal for the first to ith blocks;
a power combination section configured to combine signals that have passed through the first to ith blocks to obtain a combined signal; and
an output terminal configured to output the combined signal,
wherein the first to ith blocks each include:
a frequency converter configured to convert a frequency of a signal that passes through each of the first to ith blocks;
an oscillator configured to give a reference signal to the frequency converter wherein each reference signal has first to ith frequencies (first frequency<second frequency< . . . <ith frequency) included within a band of the transmission signal;
an amplifier configured to amplify a signal that passes through the first to ith blocks; and
a single resonator configured to have a resonance frequency of the same frequency as each of the first to ith frequencies and extract a signal having each of the first to ith frequencies as a center frequency from an amplified signal by each amplifier,
wherein a jth (j: an integer between 1 and i−1) block further includes a phase adjustment section which provides an output signal of the jth block with a phase difference within a range of {(180±30)+(360×n)} degrees (n: an integer of 0 or greater) from an output signal that passes through a (j+1)th block.

14. The circuit according to claim 13, wherein the phase adjustment section is a delay circuit.

15. The circuit according to claim 13, wherein the (j+1)th block further includes a phase adjustment section which provides an output signal of the (j+1) th block with a phase difference within a range of {(180±30)+(360×n)} degrees (n: an integer of 0 or greater) from an output signal that passes through the jth block.

16. The circuit according to claim 15, wherein the phase adjustment section is a delay circuit.

* * * * *